United States Patent
Gunji-Yoneoka et al.

(10) Patent No.: US 9,768,270 B2
(45) Date of Patent: Sep. 19, 2017

(54) METHOD OF SELECTIVELY DEPOSITING FLOATING GATE MATERIAL IN A MEMORY DEVICE

(71) Applicant: SANDISK TECHNOLOGIES INC., Plano, TX (US)

(72) Inventors: Marika Gunji-Yoneoka, Sunnyvale, CA (US); Atsushi Suyama, San Jose, CA (US); Kensuke Yamaguchi, Kuwana (JP); Hiroyuki Kinoshita, San Jose, CA (US); Raghuveer S. Makala, Campbell, CA (US); Rahul Sharangpani, Fremont, CA (US); Shigehisa Inoue, Yokkalchi (JP); Tuan Pham, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/840,474

(22) Filed: Aug. 31, 2015

(65) Prior Publication Data
US 2015/0380419 A1    Dec. 31, 2015

Related U.S. Application Data

(63) Continuation-in-part of application No. 14/314,370, filed on Jun. 25, 2014, now Pat. No. 9,379,124.

(51) Int. Cl.
*G11C 11/34* (2006.01)
*H01L 29/51* (2006.01)
(Continued)

(52) U.S. Cl.
CPC ........ *H01L 29/517* (2013.01); *H01L 21/0209* (2013.01); *H01L 21/02087* (2013.01);
(Continued)

(58) Field of Classification Search
CPC ............. H01L 29/517; H01L 21/28273; H01L 21/32134; H01L 21/31111; H01L 27/11556; H01L 29/0649
(Continued)

(56) References Cited

U.S. PATENT DOCUMENTS

| | | | |
|---|---|---|---|
| 4,269,682 A | * | 5/1981 | Yano .................... G01N 27/414 204/406 |
| 5,084,417 A | | 1/1992 | Joshi et al. |

(Continued)

FOREIGN PATENT DOCUMENTS

WO    WO02/15277 A2    2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Viet Q Nguyen
(74) *Attorney, Agent, or Firm* — The Marbury Law Group PLLC

(57) ABSTRACT

Undesirable metal contamination from a selective metal deposition process can be minimized or eliminated by employing a first material layer on a bevel and a back side of a substrate, while providing a second material layer only on a front side of the substrate. The first material layer and the second material layer are selected such that a selective deposition process of a metal material provides a metal material portion only on the second material layer, while no deposition occurs on the first material layer or isolated islands of the metal material are formed on the first material layer. Any residual metal material can be removed from the
(Continued)

bevel and the back side by a wet etch to reduce or prevent metal contamination from the deposited metal material.

7 Claims, 24 Drawing Sheets

(51) Int. Cl.
| | | |
|---|---|---|
| H01L 21/28 | (2006.01) | |
| H01L 21/3213 | (2006.01) | |
| H01L 21/311 | (2006.01) | |
| H01L 27/11556 | (2017.01) | |
| H01L 29/06 | (2006.01) | |
| H01L 21/3205 | (2006.01) | |
| H01L 21/02 | (2006.01) | |
| H01L 27/11582 | (2017.01) | |

(52) U.S. Cl.
CPC .. *H01L 21/28273* (2013.01); *H01L 21/31111* (2013.01); *H01L 21/32051* (2013.01); *H01L 21/32134* (2013.01); *H01L 27/11556* (2013.01); *H01L 29/0649* (2013.01); *H01L 21/28282* (2013.01); *H01L 27/11582* (2013.01)

(58) Field of Classification Search
USPC ..... 365/185.17; 257/314, 316; 438/261, 297
See application file for complete search history.

(56) References Cited

U.S. PATENT DOCUMENTS

| | | | |
|---|---|---|---|
| 5,807,788 A | | 9/1998 | Brodsky et al. |
| 5,915,167 A | | 6/1999 | Leedy |
| 7,177,191 B2 | | 2/2007 | Fasoli et al. |
| 7,221,588 B2 | | 5/2007 | Fasoli et al. |
| 7,233,522 B2 | | 6/2007 | Chen et al. |
| 7,514,321 B2 | | 4/2009 | Mokhlesi et al. |
| 7,575,973 B2 | | 8/2009 | Mokhlesi et al. |
| 7,691,442 B2 | | 4/2010 | Gandikota et al. |
| 7,745,265 B2 | | 6/2010 | Mokhlesi et al. |
| 7,745,312 B2 | | 6/2010 | Herner et al. |
| 7,808,038 B2 | | 10/2010 | Mokhlesi et al. |
| 7,848,145 B2 | | 12/2010 | Mokhlesi et al. |
| 7,851,851 B2 | | 12/2010 | Mokhlesi et al. |
| 8,008,710 B2 | | 8/2011 | Fukuzumi |
| 8,053,829 B2 | | 11/2011 | Kang et al. |
| 8,187,936 B2 | | 5/2012 | Alsmeier et al. |
| 8,193,054 B2 | | 6/2012 | Alsmeier |
| 8,198,672 B2 | | 6/2012 | Alsmeier |
| 8,283,228 B2 | | 10/2012 | Alsmeier |
| 8,349,681 B2 | | 1/2013 | Alsmeier et al. |
| 8,614,126 B1 | | 12/2013 | Lee et al. |
| 8,928,061 B2 | | 1/2015 | Chien et al. |
| 9,093,480 B2 | | 7/2015 | Makala et al. |
| 9,159,739 B2 | | 10/2015 | Makala et al. |
| 9,236,392 B1 | | 1/2016 | Izumi et al. |
| 9,379,124 B2 * | | 6/2016 | Sharangpani ..... H01L 27/11556 |
| 9,397,093 B2 | | 7/2016 | Makala et al. |
| 9,397,107 B2 | | 7/2016 | Makala et al. |
| 9,570,455 B2 * | | 2/2017 | Sharangpani ..... H01L 27/11556 |
| 2004/0018748 A1 * | | 1/2004 | Lu ..................... H01L 21/76801 438/778 |
| 2006/0075504 A1 * | | 4/2006 | Liu ..................... G06F 11/2294 726/25 |
| 2006/0281336 A1 * | | 12/2006 | Arisumi ............... H01L 21/312 438/787 |
| 2007/0128815 A1 * | | 6/2007 | Iino ..................... H01L 27/115 438/297 |
| 2007/0210338 A1 | | 9/2007 | Orlowski |
| 2007/0224760 A1 * | | 9/2007 | Matsui ..................... C09G 1/02 438/257 |
| 2007/0252201 A1 | | 11/2007 | Kito et al. |
| 2008/0268288 A1 * | | 10/2008 | Jin ..................... B81C 1/00031 428/800 |
| 2008/0285353 A1 * | | 11/2008 | Park ..................... G11C 16/349 365/185.18 |
| 2009/0155967 A1 * | | 6/2009 | Purayath ................ B82Y 10/00 438/261 |
| 2010/0044778 A1 | | 2/2010 | Seol |
| 2010/0044779 A1 * | | 2/2010 | Seol .................. H01L 21/28282 257/326 |
| 2010/0075504 A1 * | | 3/2010 | Tomita ............... H01L 21/02057 438/706 |
| 2010/0112769 A1 | | 5/2010 | Son et al. |
| 2010/0120214 A1 | | 5/2010 | Park et al. |
| 2010/0155810 A1 | | 6/2010 | Kim et al. |
| 2010/0155818 A1 | | 6/2010 | Cho |
| 2010/0181610 A1 | | 7/2010 | Kim et al. |
| 2010/0207195 A1 | | 8/2010 | Fukuzumi et al. |
| 2010/0320528 A1 | | 12/2010 | Jeong et al. |
| 2011/0076819 A1 | | 3/2011 | Kim et al. |
| 2011/0121381 A1 * | | 5/2011 | Kanemura ......... G11C 16/0441 257/321 |
| 2011/0133606 A1 | | 6/2011 | Yoshida et al. |
| 2011/0266606 A1 | | 11/2011 | Park et al. |
| 2012/0001247 A1 | | 1/2012 | Alsmeier |
| 2012/0001249 A1 | | 1/2012 | Alsmeier |
| 2012/0073992 A1 * | | 3/2012 | Kim ..................... B82Y 10/00 205/792 |
| 2012/0256247 A1 | | 10/2012 | Alsmeier |
| 2013/0095646 A1 | | 4/2013 | Alsmeier et al. |
| 2013/0234130 A1 | | 9/2013 | Ino |
| 2013/0248974 A1 | | 9/2013 | Alsmeier et al. |
| 2013/0264631 A1 | | 10/2013 | Alsmeier et al. |
| 2013/0313627 A1 | | 11/2013 | Lee et al. |
| 2014/0001535 A1 * | | 1/2014 | Purayath ........... H01L 29/66825 257/324 |
| 2014/0008714 A1 | | 1/2014 | Makala et al. |
| 2014/0045307 A1 | | 2/2014 | Alsmeier et al. |
| 2014/0151778 A1 * | | 6/2014 | Purayath ........... H01L 21/28273 257/316 |
| 2014/0231898 A1 * | | 8/2014 | Hattori ................ H01L 29/4234 257/324 |
| 2014/0252447 A1 * | | 9/2014 | Lee ................... H01L 29/66825 257/316 |
| 2014/0264525 A1 | | 9/2014 | Takahashi et al. |
| 2015/0294978 A1 | | 10/2015 | Lu et al. |
| 2015/0318297 A1 | | 11/2015 | Hada |
| 2015/0380422 A1 * | | 12/2015 | Sharangpani ..... H01L 27/11556 365/185.17 |
| 2016/0149002 A1 * | | 5/2016 | Sharangpani ....... H01L 29/1054 257/314 |
| 2016/0149049 A1 * | | 5/2016 | Sharangpani ....... H01L 29/7889 257/314 |
| 2016/0172370 A1 * | | 6/2016 | Makala ............. H01L 27/11582 257/314 |

OTHER PUBLICATIONS

Katsumata et al., "Pipe-Shaped BiCS Flash Memory with 16 Stacked Layers and Multi-Level-Cell Operation for Ultra High Density Storage Devices" 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

(56) References Cited

OTHER PUBLICATIONS

Jang et al., "Memory Properties of Nickel Silicide Nanocrystal Layer for Possible Application to Nonvolatile Memory Devices," IEEE Transactions on Electron Devices, vol. 56, No. 12, Dec. 2009.
Chen et al., "Reliability Characteristics of NiSi Nanocrystals Embedded in Oxide and Nitride Layers for Nonvolatile Memory Application," Applied Physics Letters 92, 152114 (2008).
J. Ooshita, Toshiba Announces 32Gb 3D-Stacked Multi-Level NAND Flash, 3 pages, http://techon.nikkeibp.co.jP/english/NEWS_EN/20090619/171977/ Nikkei Microdevices, Tech-On, Jun. 19, 2009.
Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).
Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.
U.S. Appl. No. 13/762,988, filed Feb. 8, 2013, SanDisk Technologies Inc.
U.S. Appl. No. 14/133,979, filed Dec. 19, 2013, SanDisk Technologies Inc.
U.S. Appl. No. 14/183,152, filed Feb. 18, 2014, SanDisk Technologies Inc.
U.S. Appl. No. 14/219,161, filed Mar. 19, 2014, SanDisk Technologies Inc.
U.S. Appl. No. 14/225,116, filed Mar. 25, 2014, SanDisk Technologies Inc.
U.S. Appl. No. 14/225,176, filed Mar. 25, 2014, SanDisk Technologies Inc.
U.S. Appl. No. 14/264,262, filed Apr. 29, 2014, SanDisk Technologies Inc.
U.S. Appl. No. 14/264,312, filed Apr. 29, 2014, SanDisk Technologies Inc.
U.S. Appl. No. 14/264,407, filed Apr. 29, 2014, SanDisk Technologies Inc.
U.S. Appl. No. 14/282,567, filed May 20, 2014, SanDisk Technologies Inc.
Non-Final Office Action from U.S. Appl. No. 15/177,737, dated Mar. 15, 2017, 20 pages.

\* cited by examiner

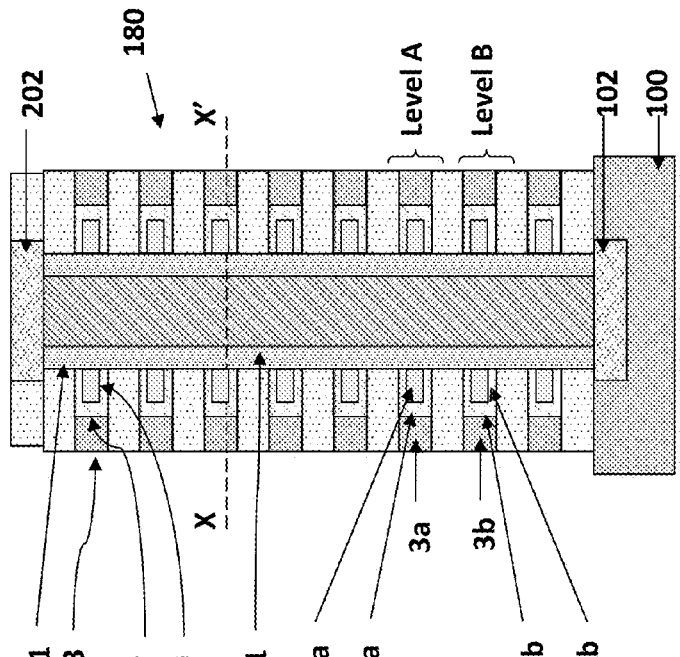
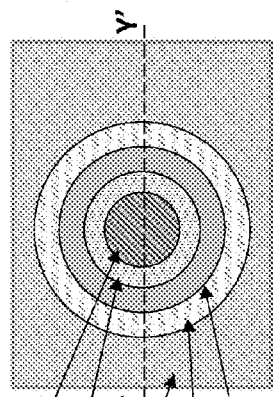
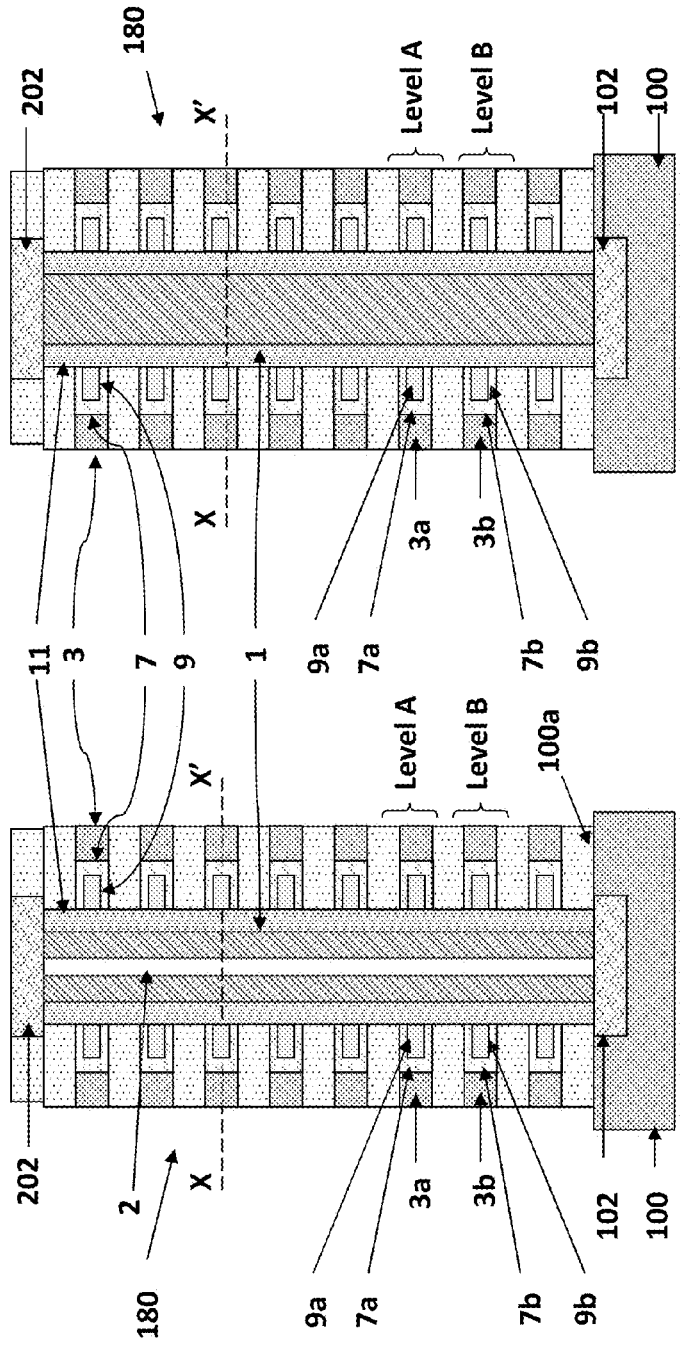
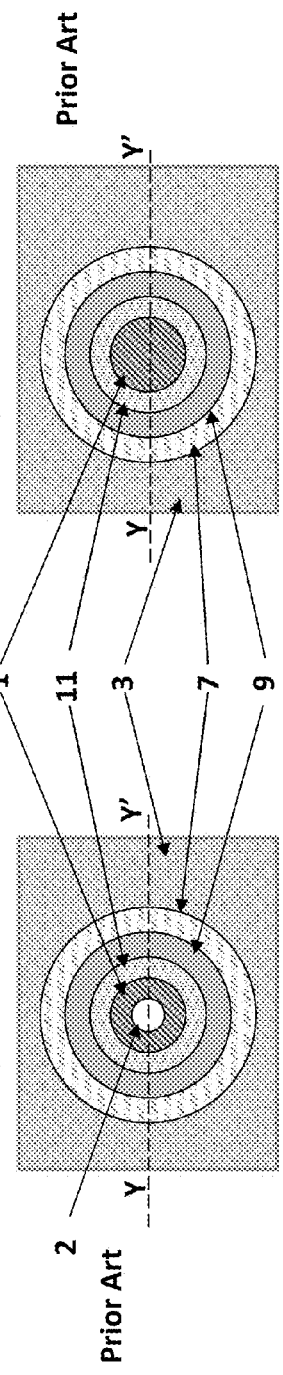

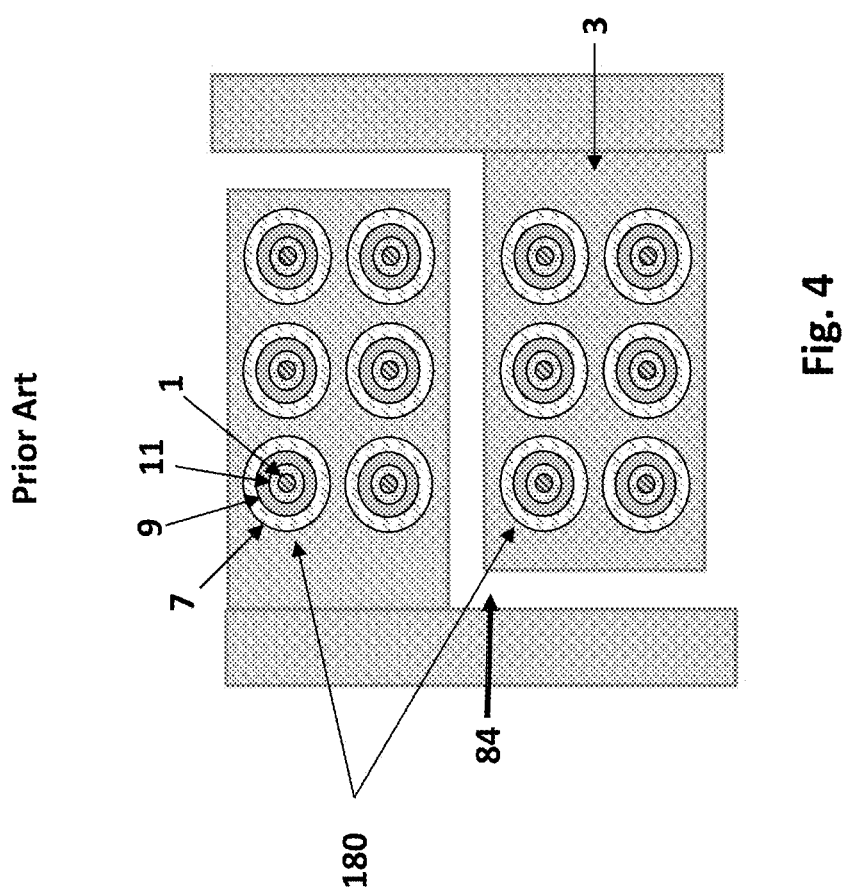

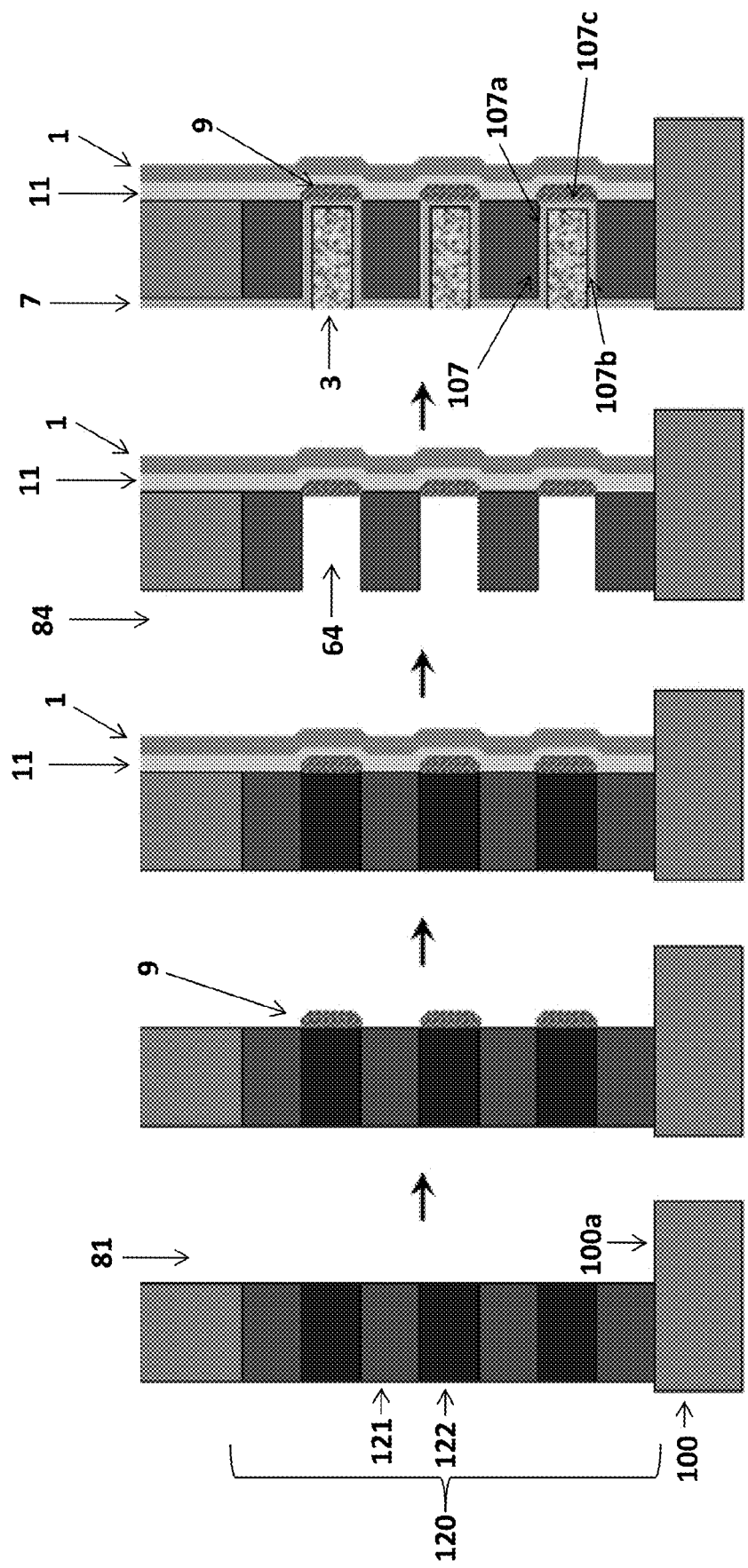

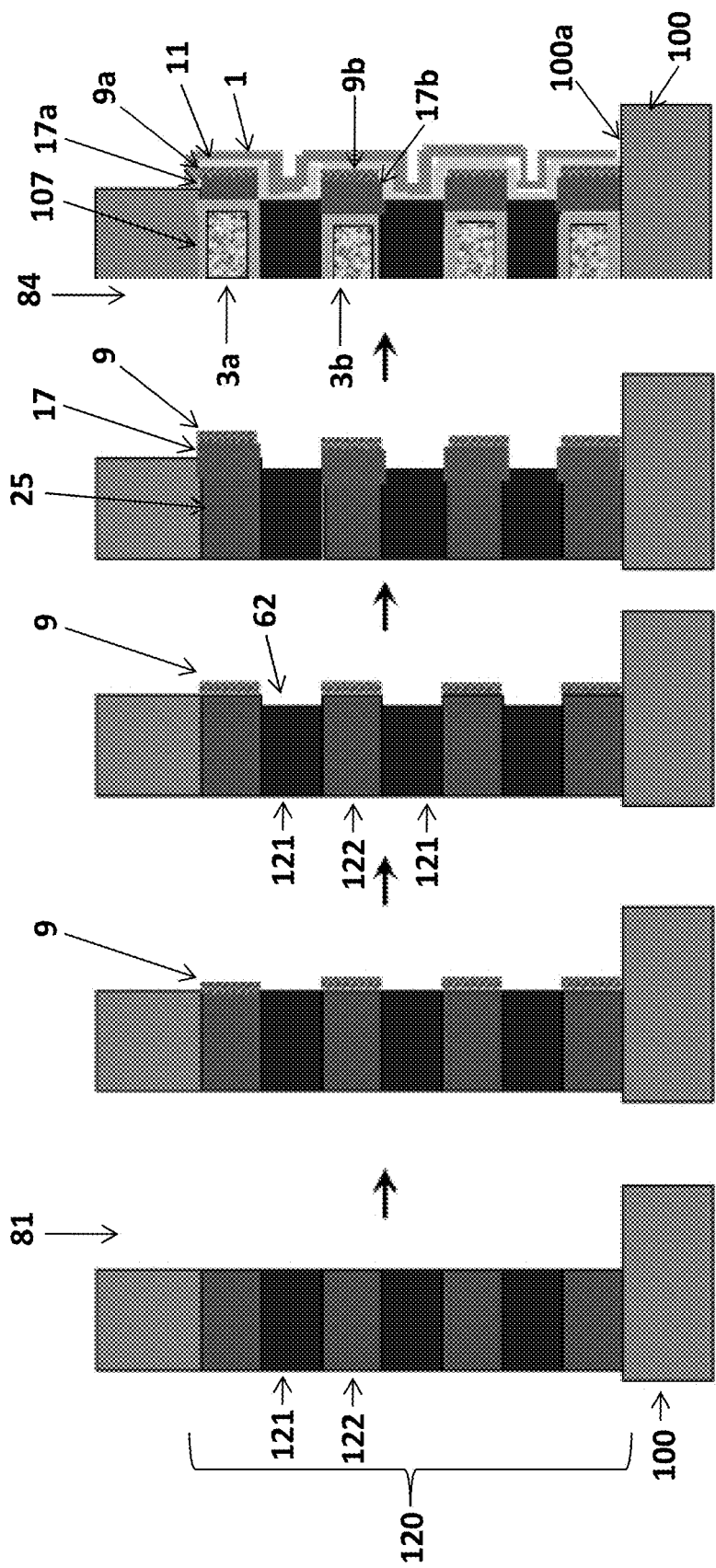

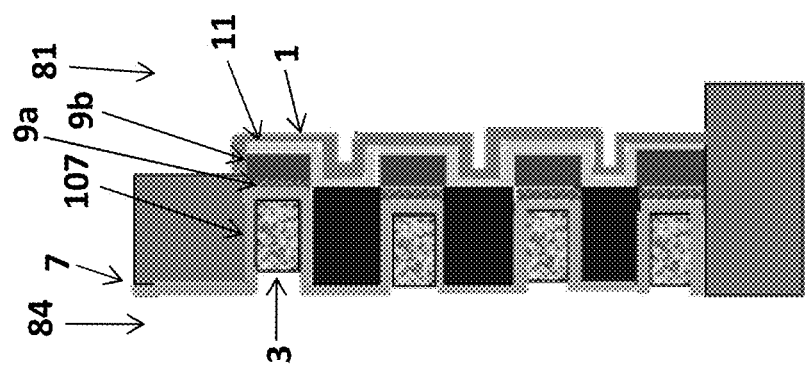
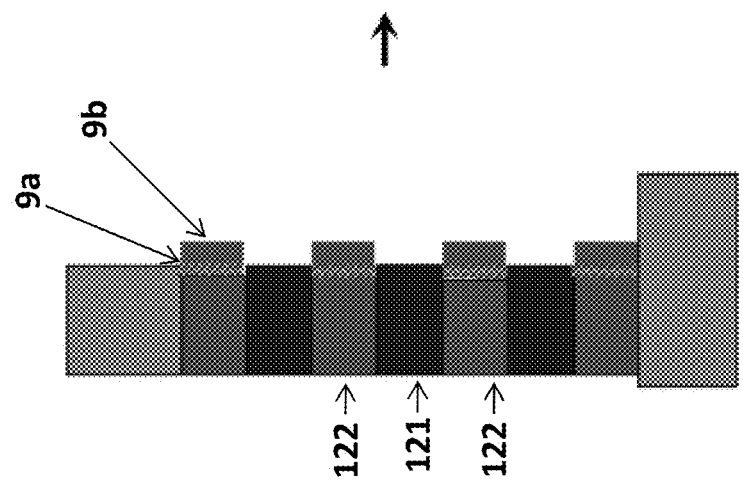
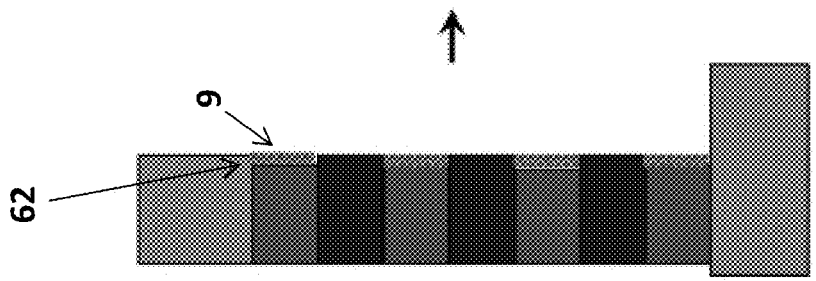
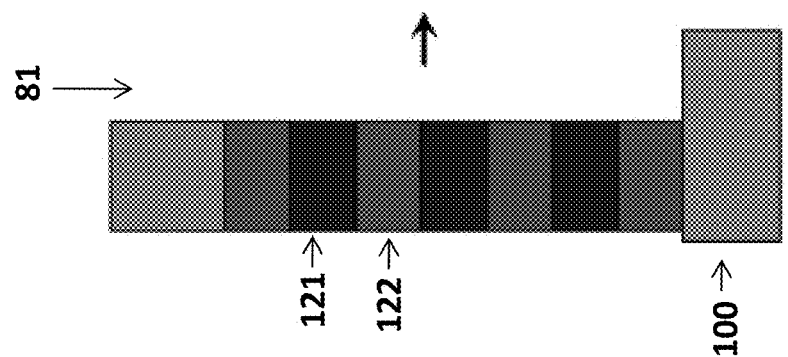

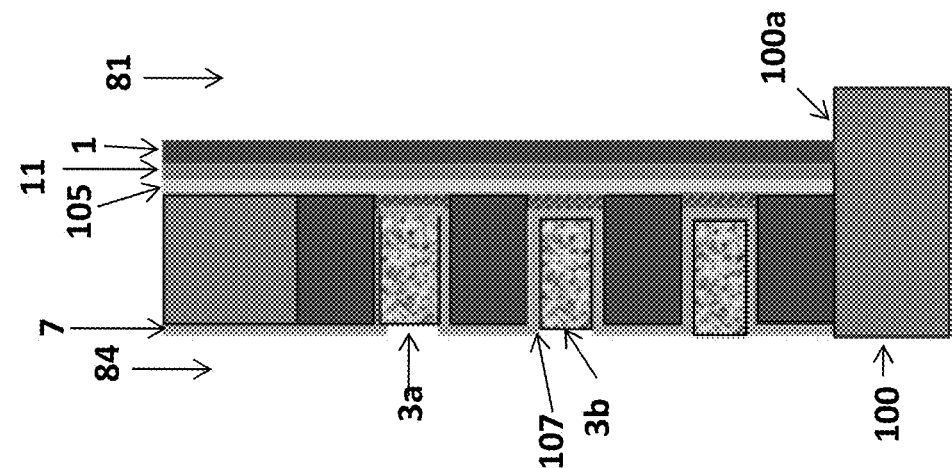
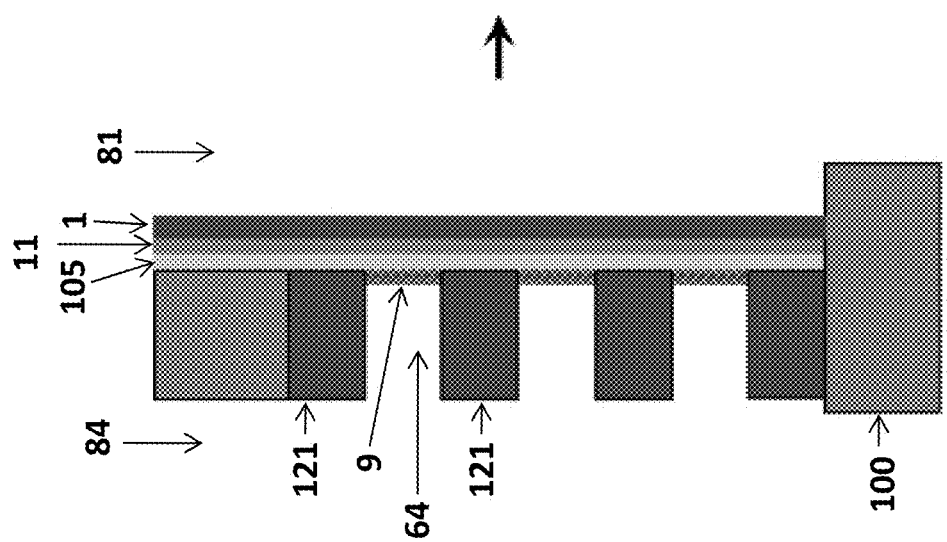
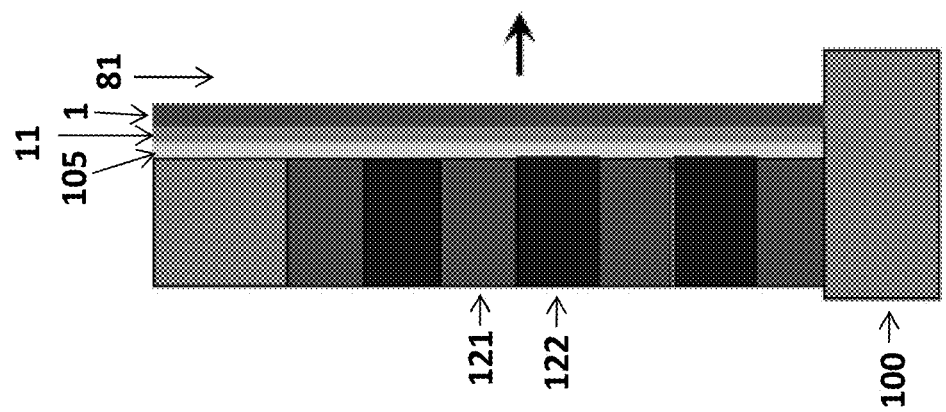

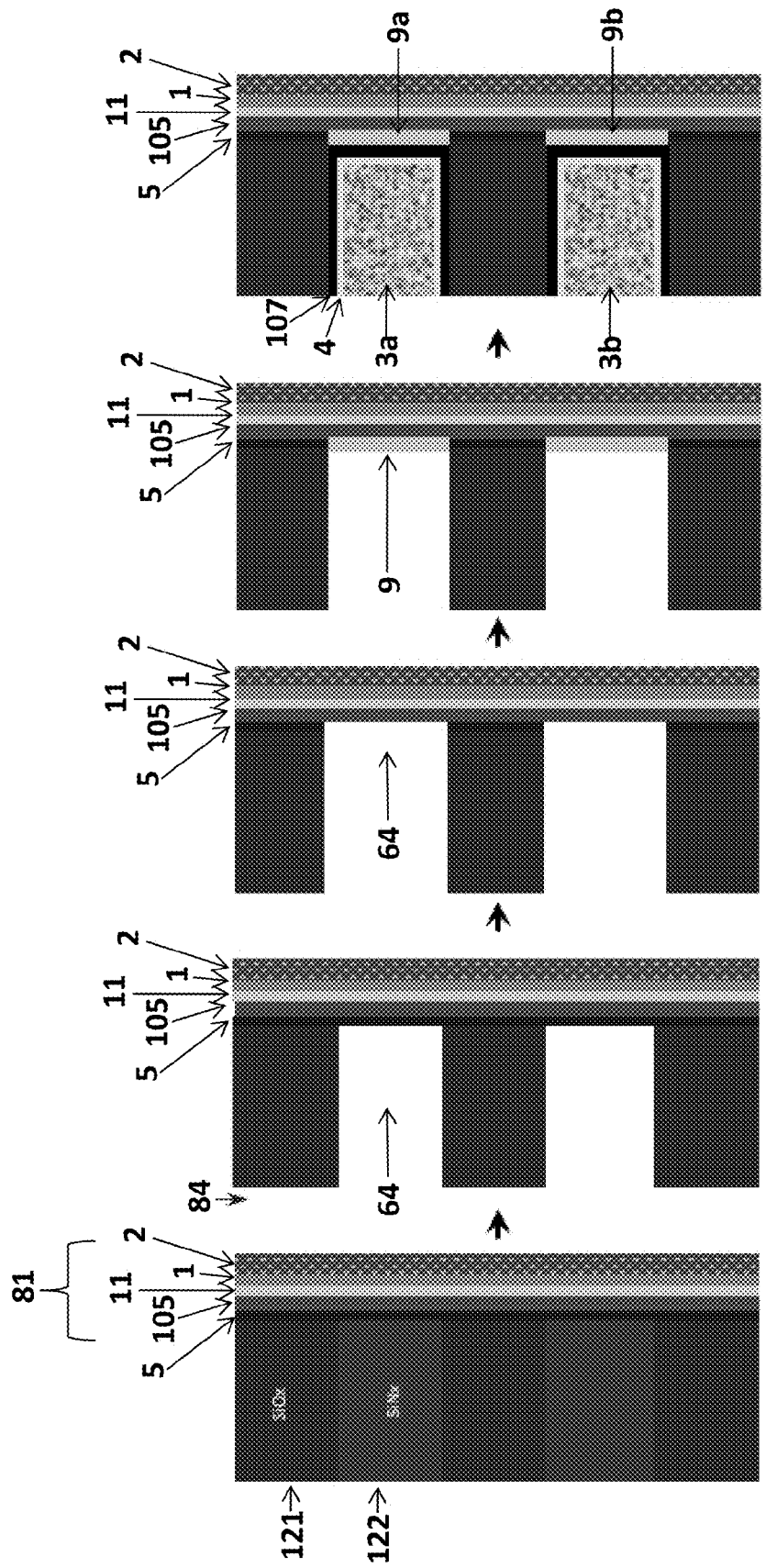

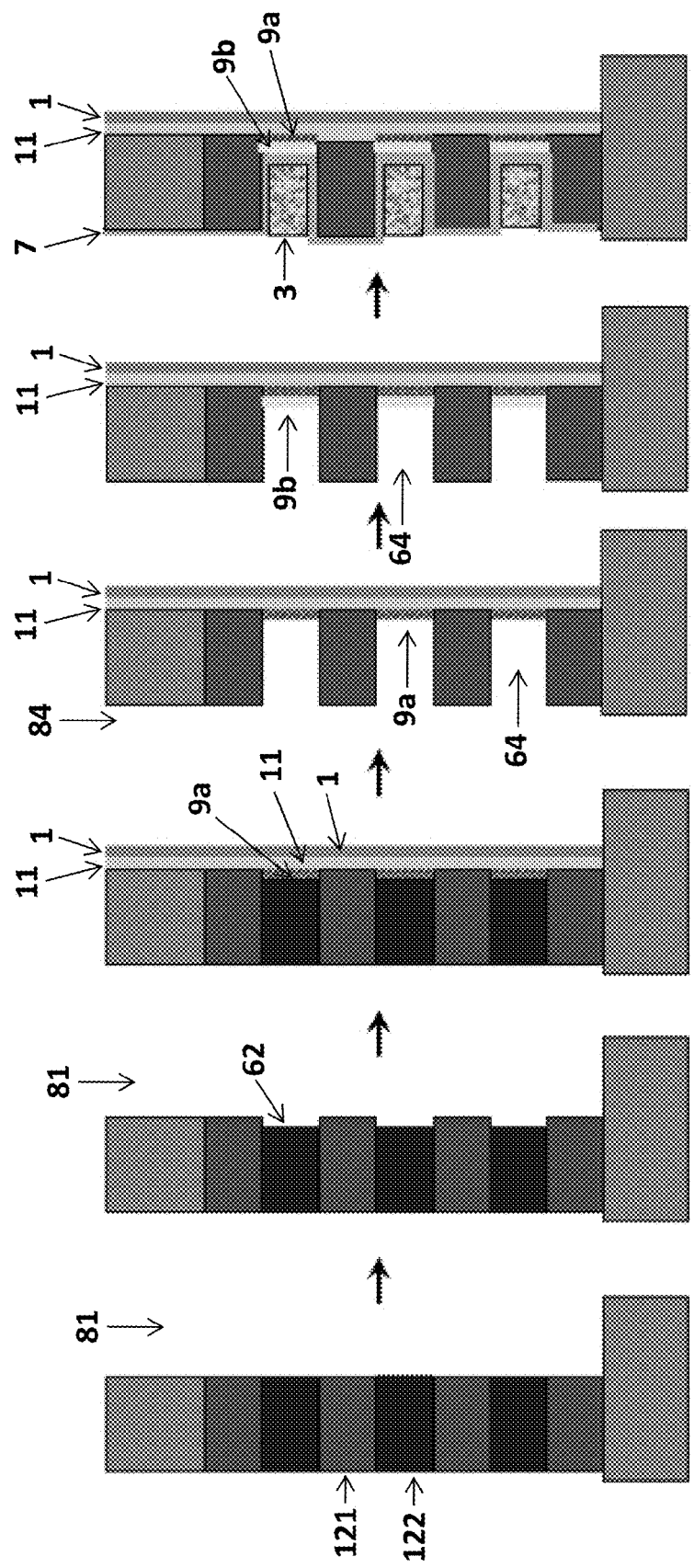

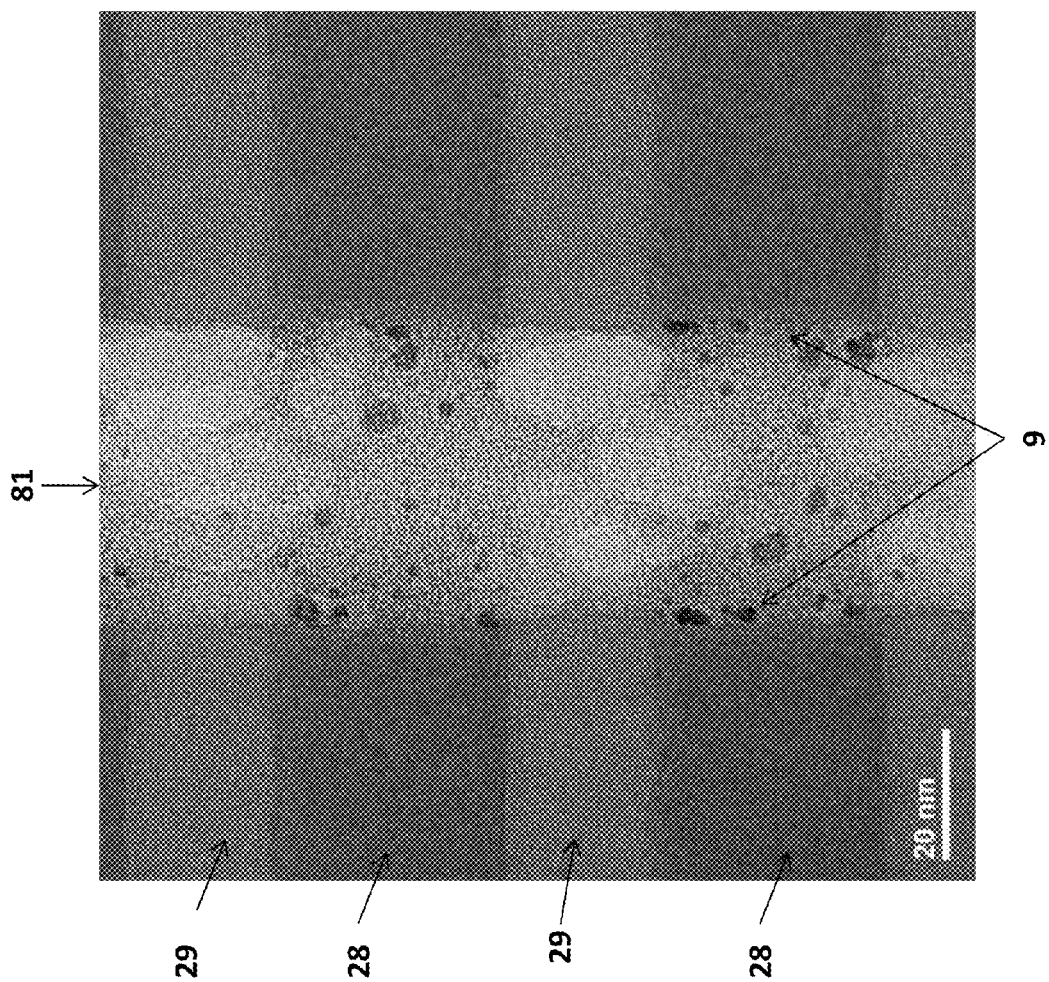

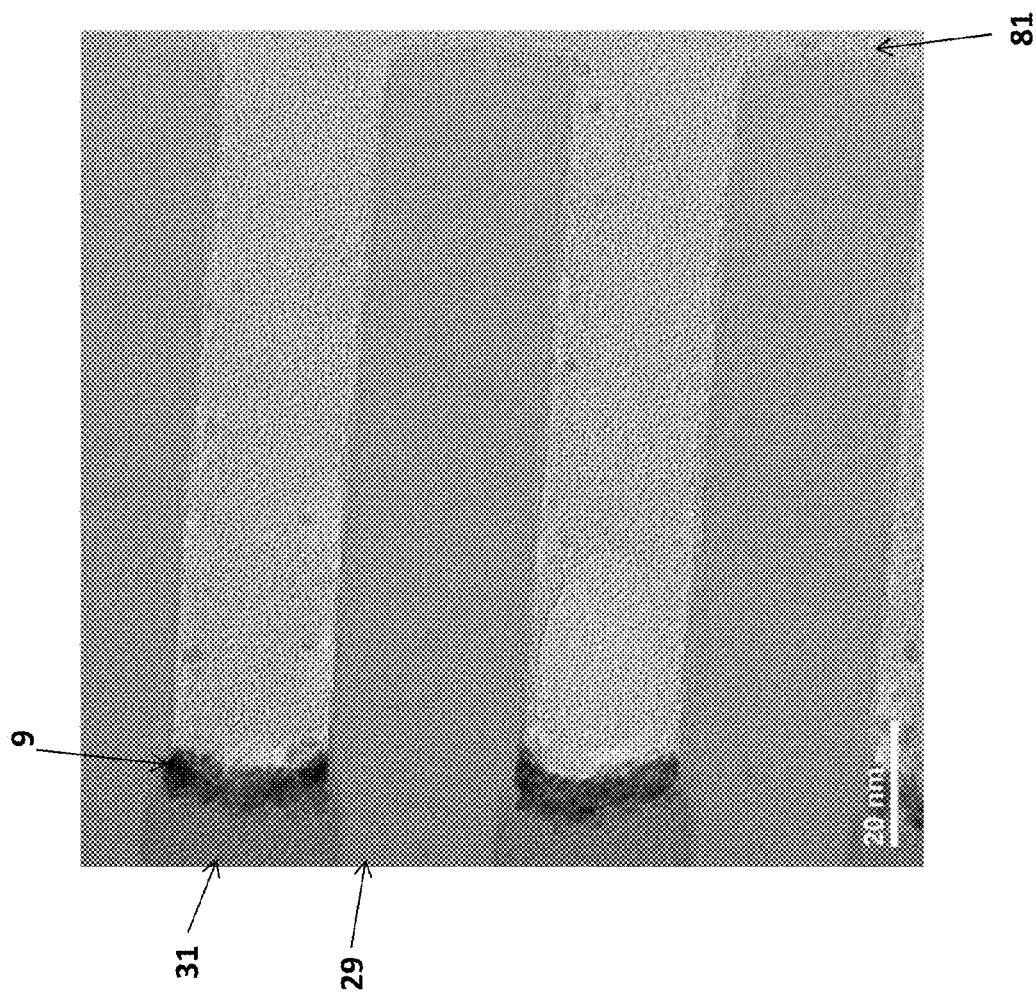

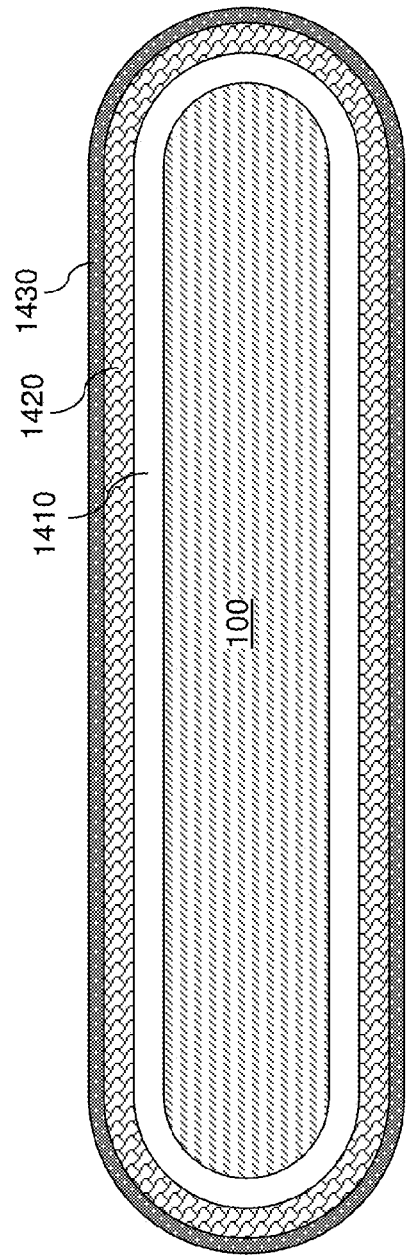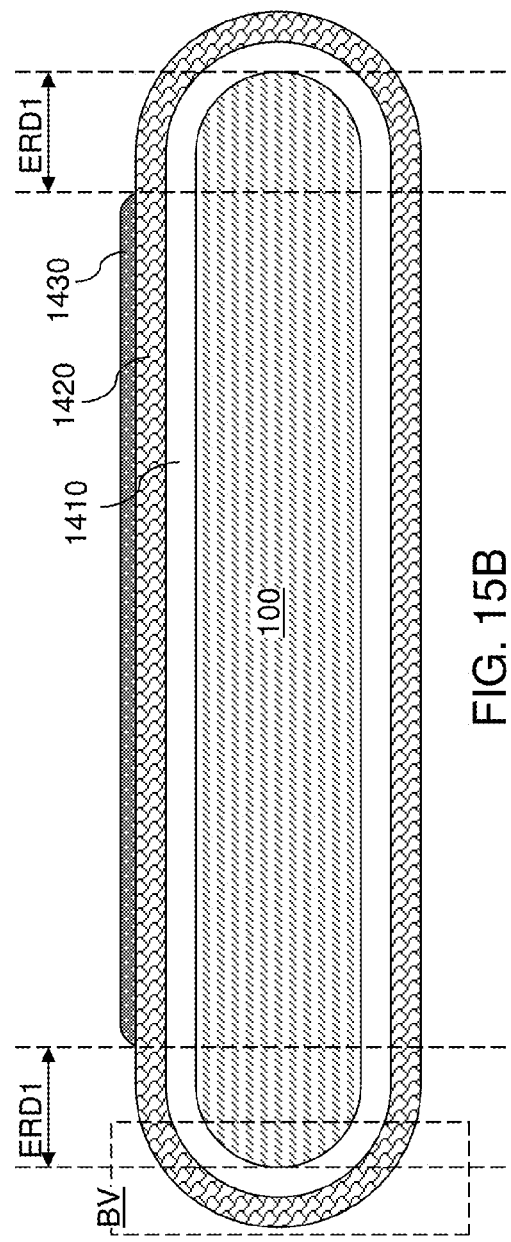

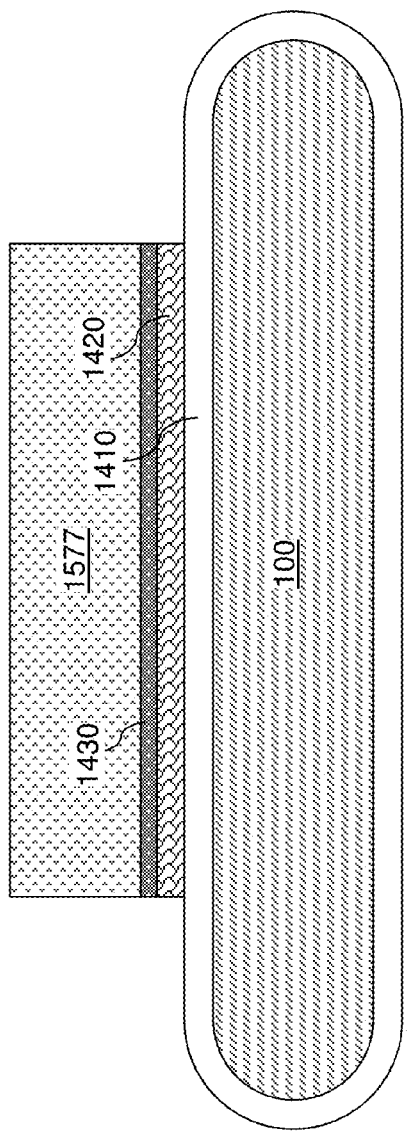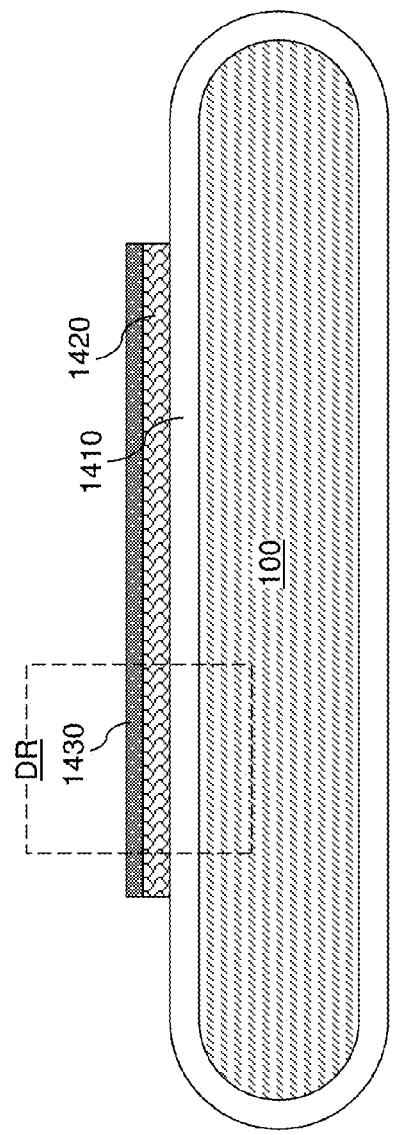

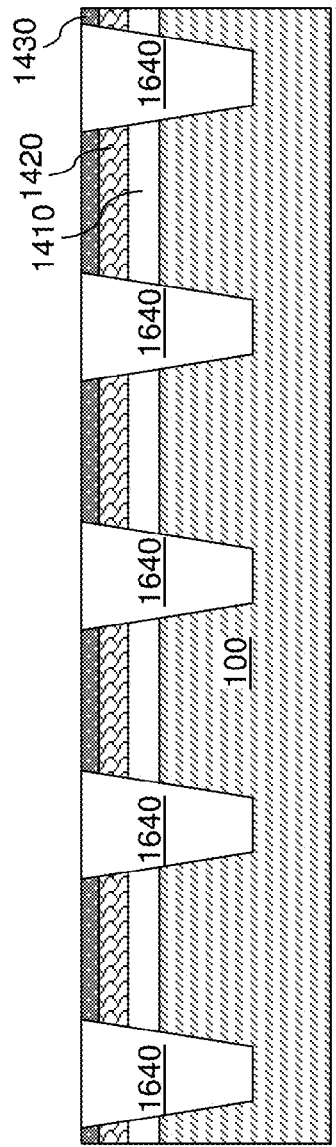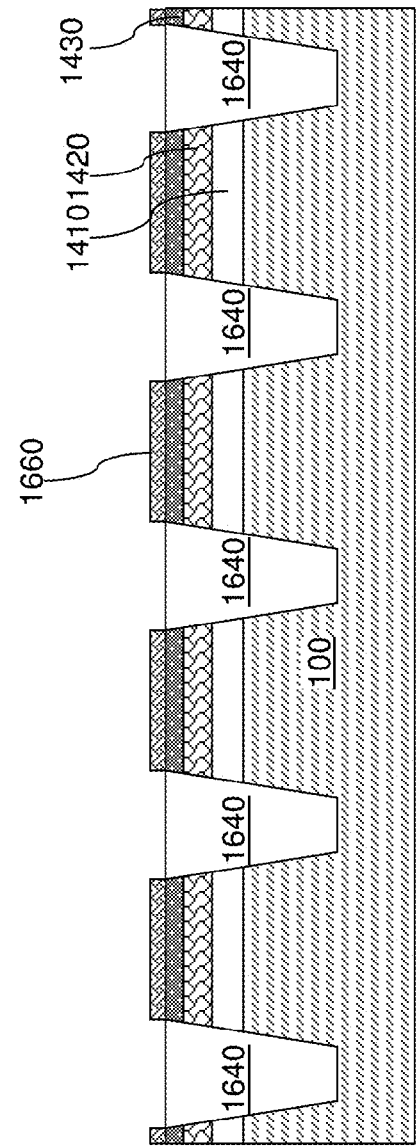

METHOD OF SELECTIVELY DEPOSITING FLOATING GATE MATERIAL IN A MEMORY DEVICE

RELATED APPLICATION

The present application is a continuation-in-part (CIP) application of U.S. patent application Ser. No. 14/314,370 filed on Jun. 25, 2014, the entire contents of which is incorporated herein by reference.

FIELD

The present disclosure relates generally to the field of semiconductor devices and specifically to methods of selective floating gate metal deposition with reduced metal contamination.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

According to an aspect of the present disclosure, a method of forming a semiconductor structure is provided. A stack comprising a first material layer including a first material and a second material layer including a second material is formed on a front side and a back side of a substrate. The second material layer is removed from a bevel and the back side of the substrate. Surfaces of the first material layer are physically exposed at the bevel and the back side. A selective metal deposition process is performed, which deposits a metal material at a higher nucleation density on the second material layer than on the first material layer. The metal material is deposited as at least one continuous layer on the second material layer and as isolated islands on the first material layer. The isolated islands of the metal material are removed from the bevel and the back side, while the at least one layer of the metal material is not removed.

According to an aspect of the present disclosure, a hybrid NAND memory device, comprises a semiconductor channel located in a substrate, a shallow trench isolation structure laterally contacting the semiconductor channel, a tunneling dielectric layer located on the semiconductor channel, a hybrid floating gate structure comprising a stack of a semiconductor floating gate, a charge trapping dielectric and a metal capping layer located over the tunneling dielectric layer, a blocking dielectric layer overlying the hybrid floating gate structure, and a plurality of control gate electrodes overlying the blocking dielectric layer. The metal capping layer is located entirely above a top surface of the shallow trench isolation structure.

According to another aspect of the present disclosure, a method of making a NAND memory device which includes a semiconductor channel and a plurality of control gate electrodes, comprises selectively forming metal floating gate material on a second dielectric material surface having a lesser hydrophobicity than a first dielectric material surface.

An embodiment relates to a method of making a monolithic three dimensional NAND string that includes a semiconductor channel and a plurality of control gate electrodes. The method includes selectively forming a plurality of discrete charge storage regions using atomic layer deposition. The plurality of discrete charge storage regions includes at least one of a metal or an electrically conductive metal oxide.

Another embodiment relates to a monolithic three dimensional NAND string including a semiconductor channel, at least one end portion of the semiconductor channel extending substantially perpendicular to a major surface of a substrate. The NAND string also includes a plurality of control gate electrodes extending substantially parallel to the major surface of the substrate. The plurality of control gate electrodes comprise at least a first control gate electrode located in a first device level and a second control gate electrode located in a second device level located over the major surface of the substrate and below the first device level. The NAND string also includes a blocking dielectric located in contact with the plurality of control gate electrodes and a plurality of vertically spaced apart etch stop dielectric strips located in contact with the blocking dielectric. The plurality of vertically spaced apart etch stop dielectric strips comprise at least a first spaced apart etch stop dielectric strip located in the first device level and a second spaced apart etch stop dielectric strip located in the second device level. The NAND also includes a plurality of vertically spaced apart charge storage regions comprising at least one of a metal or an electrically conductive metal oxide and located in contact with the etch stop dielectric strips. The plurality of vertically spaced apart charge storage regions comprise at least a first spaced apart charge storage region located in the first device level and a second spaced apart charge storage region located in the second device level. The NAND string also includes a tunnel dielectric located between each one of the plurality of the vertically spaced apart metal charge storage regions and the semiconductor channel.

Another embodiment relates to a monolithic three dimensional NAND string including a semiconductor channel, at least one end portion of the semiconductor channel extending substantially perpendicular to a major surface of a substrate and a plurality of control gate electrodes extending substantially parallel to the major surface of the substrate. The plurality of control gate electrodes comprise at least a first control gate electrode located in a first device level and a second control gate electrode located in a second device level located over the major surface of the substrate and below the first device level. The NAND string also includes a blocking dielectric located in contact with the plurality of control gate electrodes, a continuous charge storage dielectric layer and a plurality of vertically spaced apart charge storage regions comprising at least one of ruthenium or $RuO_2$ and located in contact with the continuous charge storage dielectric layer. The plurality of vertically spaced apart ruthenium or $RuO_2$ charge storage regions comprise at least a first spaced apart ruthenium or $RuO_2$ charge storage region located in the first device level and a second spaced apart ruthenium or $RuO_2$ charge storage region located in the second device level. The NAND string also includes a tunnel dielectric located between the continuous charge storage dielectric layer and the semiconductor channel.

Another embodiment relates to a monolithic three dimensional NAND string including a semiconductor channel, at least one end portion of the semiconductor channel extending substantially perpendicular to a major surface of a substrate and a plurality of control gate electrodes extending substantially parallel to the major surface of the substrate. The plurality of control gate electrodes comprise at least a first control gate electrode located in a first device level and a second control gate electrode located in a second device level located over the major surface of the substrate and below the first device level. The NAND string also includes a blocking dielectric located in contact with the plurality of control gate electrodes and a plurality of vertically spaced apart nanoparticle charge storage regions comprising at least one of ruthenium or $RuO_2$ nanoparticles. The plurality of vertically spaced apart nanoparticle charge storage regions comprise at least a first spaced apart nanoparticle charge storage region located in the first device level and a second spaced apart nanoparticle charge storage region located in the second device level. The NAND string also includes a tunnel dielectric located between each one of the plurality of the vertically spaced apart metal nanoparticle charge storage regions and the semiconductor channel.

BRIEF DESCRIPTION OF THE DRAWINGS

FIGS. 1A and 1B are respectively side cross sectional and top cross sectional views of a conventional NAND string. FIG. 1A is a side cross sectional view of the device along line Y-Y' in FIG. 1B, while FIG. 1B is a side cross sectional view of the device along line X-X' in FIG. 1A.

FIGS. 2A and 2B are respectively side cross sectional and top cross sectional views of another conventional NAND string. FIG. 2A is a side cross sectional view of the device along line Y-Y' in FIG. 2B, while FIG. 2B is a side cross sectional view of the device along line X-X' in FIG. 2A.

FIG. 4 is a top schematic view of a portion of a conventional memory device comprising NAND strings.

FIGS. 5A-5E illustrate a method of making a NAND string according to an embodiment.

FIGS. 6A-6E illustrate a method of making a NAND string according to an embodiment.

FIGS. 7A-7D illustrate a method of making a NAND string according to an embodiment.

FIGS. 8A-8C illustrate a method of making a NAND string according to an embodiment.

FIGS. 9A-9E illustrate a method of making a NAND string according to an embodiment.

FIGS. 10A-10F illustrate a method of making a NAND string according to an embodiment.

FIG. 11C is a TEM micrograph illustrating selective conformal coating of a ruthenium floating gate layer on polysilicon layers according to another embodiment in which the polysilicon layers are not recessed in an OPOP stack.

FIGS. 12A and 12B are TEM micrographs illustrating selective conformal coating of a ruthenium floating gate layer on respective recessed and unrecessed silicon nitride layers in an ONON (silicon oxide/silicon nitride) stack according to another embodiment.

FIGS. 15A-15F illustrate a second exemplary process sequence that can be employed to reduce metal contamination from a selective metal material deposition process according to an embodiment of the present disclosure.

FIGS. 16A-16F illustrate a third exemplary process sequence that can be employed to reduce metal contamination from a selective metal material deposition process according to an embodiment of the present disclosure.

DETAILED DESCRIPTION

Many conventional three dimensional NAND memories store charge in silicon nitride charge storage dielectric layers. The conventional devices suffer from slow erase times, poor data retention and charge spreading. The inventors have realized that low work function conducting floating gates provide better performance than charge storage silicon nitride dielectric layers.

The inventors have discovered that the deposition of continuous or discontinuous charge storage layers may be advantageously carried out with atomic layer deposition (ALD). The ALD process is inherently selective due to surface sensitivity. Further, good results are easier to achieve with the ALD process versus chemical vapor deposition (CVD) process, which requires fine tuning of gas flows.

Additionally, the self-limiting nature of ALD allows more accurate and reproducible deposition than CVD. Additionally, the ALD process is shown to be able to deposit discrete or continuous films. Therefore, nanoparticle floating gates can be deposited via ALD on vertical surfaces and are further advantageous because they give better endurance and data retention than continuous charge storage films. In addition, the ALD methods discussed below are shown to be selective on oxide/poly/oxide/poly (OPOP) and oxide/nitride/oxide/nitride (ONON) structures unlike prior art methods. Furthermore, ALD deposition thickness is largely insensitive to wafer temperature, unlike CVD which can be very temperature sensitive. Since the charge storage layers (e.g., floating gate layers) are relatively thin, if there is a drift or non-uniformity in temperature of the deposition surfaces, then this would translate to large changes in floating gate thickness if CVD is used to deposit the floating gates, but not if ALD is used to deposit the floating gates. As discussed in more detail below, selectivity of floating gate deposition on polysilicon or nitride in both ONON and OPOP stacks are demonstrated.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 3A:
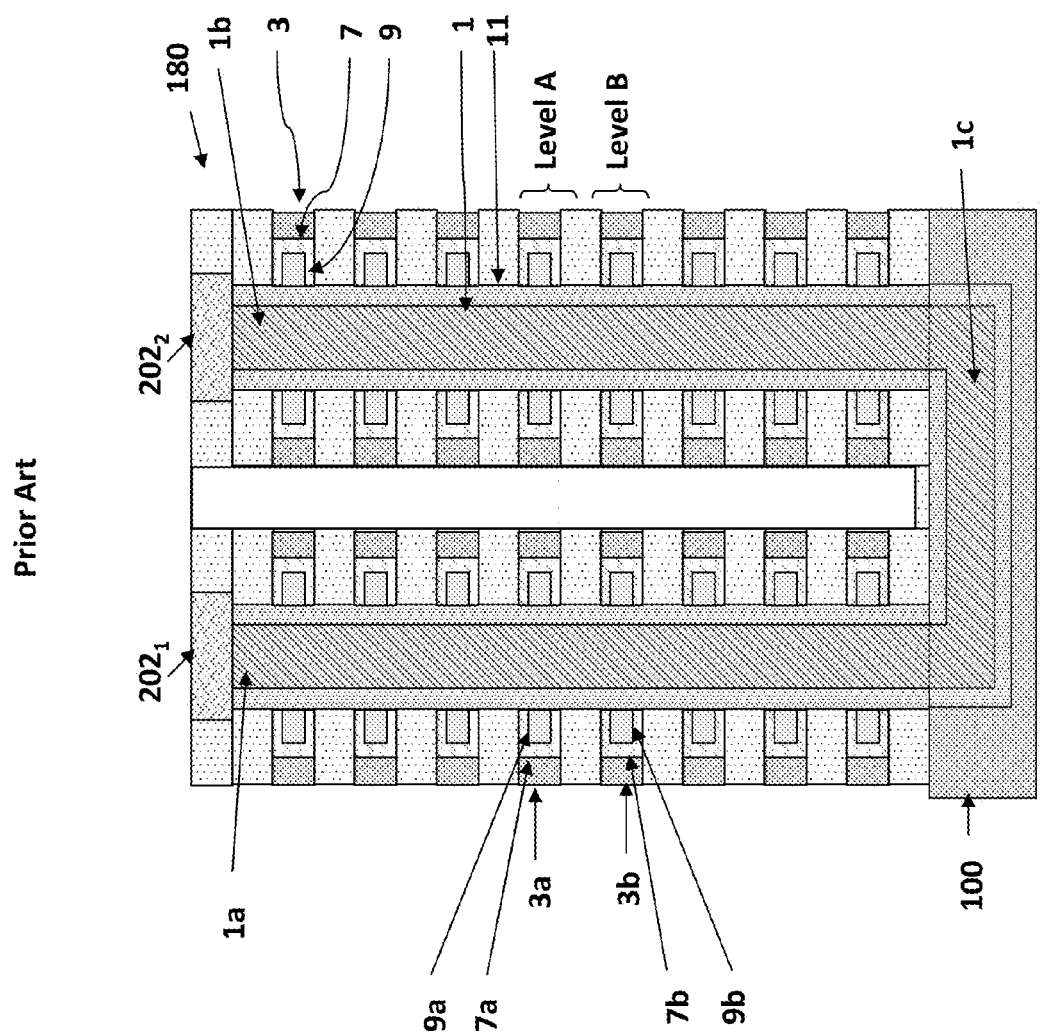
FIG. 3A is a side cross sectional view of a conventional NAND string of an embodiment with a U-shaped channel.
Figure 3B:
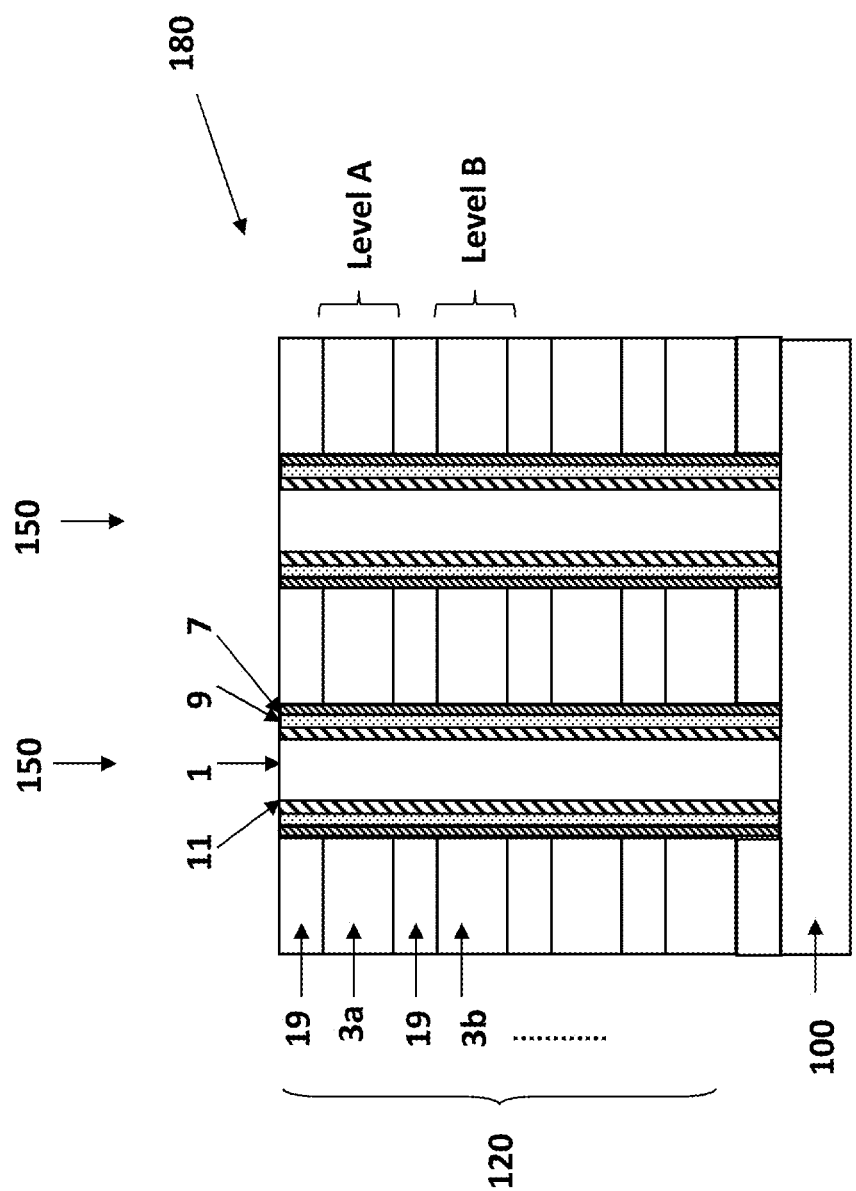
FIG. 3B is a side cross sectional view of another conventional NAND string.

In some embodiments, the monolithic three dimensional NAND string 180 comprises a semiconductor channel 1 having at least one end portion extending substantially perpendicular to a major surface 100a of a substrate 100, as shown in FIGS. 1A, 2A and 3B. "Substantially perpendicular to" (or "substantially parallel to") means within 0-10°. For example, the semiconductor channel 1 may have a pillar shape and the entire pillar-shaped semiconductor channel 1 extends substantially perpendicularly to the major surface of the substrate 100, as shown in FIGS. 1A, 2A and 3B. In these embodiments, the source/drain electrodes of the device can include a lower electrode 102 provided below the semiconductor channel 1 and an upper electrode 202 formed over the semiconductor channel 1, as shown in FIGS. 1A and 2A.

Alternatively, the semiconductor channel 1 may have a U-shaped pipe shape, as shown in FIG. 3A. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. An optional body contact electrode (not shown) may be disposed in the substrate 100 to provide body contact to the connecting portion of the semiconductor channel 1 from below. The NAND string's select or access transistors are not shown in FIGS. 1-3B for clarity.

In some embodiments, the semiconductor channel 1 may be a filled feature, as shown in FIGS. 2A, 2B, 3A and 3B. In some other embodiments, the semiconductor channel 1 may be hollow, for example a hollow cylinder filled with an insulating fill material 2, as shown in FIGS. 1A-1B. In these embodiments, an insulating fill material 2 may be formed to fill the hollow part surrounded by the semiconductor channel 1. The U-shaped pipe shape semiconductor channel 1 shown in FIG. 3A and/or the channel 1 shown in FIG. 3B may alternatively be a hollow cylinder filled with an insulating fill material 2, shown in FIGS. 1A-1B.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recyrstallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A-1B, 2A-2B, 3A and 3B. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, tungsten nitride, copper, aluminum, tantalum, titanium, cobalt, titanium nitride or alloys thereof. For example, the control gate material in FIGS. 1A, 2A and 3A may comprise a conductive metal or metal alloy, such as tungsten and/or titanium nitride, while the control gate material in FIG. 3B may comprise doped polysilicon.

A blocking dielectric 7 is located adjacent to the control gate(s) 3 and may surround the control gate 3, as shown in FIGS. 1A, 2A and 3A. Alternatively, a straight blocking dielectric layer 7 may be located only adjacent to an edge (i e, minor surface) of each control gate 3, as shown in FIG. 3B. The blocking dielectric 7 may comprise a layer having plurality of blocking dielectric segments located in contact with a respective one of the plurality of control gate electrodes 3, for example a first dielectric segment 7a located in device level A and a second dielectric segment 7b located in device level B are in contact with control electrodes 3a and 3b, respectively, as shown in FIG. 3A. Alternatively, the blocking dielectric 7 may be a straight, continuous layer, as shown in FIG. 3B, similar to the device described in U.S. Pat. No. 8,349,681 issued on Jan. 8, 2013 and incorporated herein by reference in its entirety.

The monolithic three dimensional NAND string also comprise a charge storage region 9. The charge storage region 9 may comprise one or more continuous layers which extend the entire length of the memory cell portion of the NAND string, as shown in FIG. 3B. For example, the charge storage region 9 may comprise an insulating charge trapping material, such as a silicon nitride layer.

Alternatively, the charge storage region may comprise a plurality of discrete charge storage regions 9, as shown in FIGS. 1A, 2A and 3A. The plurality of discrete charge storage regions 9 comprise at least a first discrete charge storage region 9a located in the device level A and a second discrete charge storage region 9b located in the device level B, as shown in FIG. 3A. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials. The blocking dielectric 7 and/or the tunnel dielectric 11 may include multiple layers of silicon oxide, silicon nitride and/or silicon oxynitride (e.g., ONO layers).

FIG. 4 is a top schematic view illustrating a portion of a conventional memory device comprising NAND strings 180 having channels 1 located in respective memory holes 81 (e.g., front side openings). In this device, the memory holes 81 are circular, thereby resulting in cylindrical pillar shaped NAND strings 180. From the top view, the tunnel dielectric 11, charge storage region 9 and blocking dielectric form concentric rings around the channel 1. The control gate 3 in each device level is generally slab shaped. A back side opening 84, such as a trench, electrically separates adjacent control gates 3 and NAND strings 180 from each other. As discussed in more detail below, the back side opening 84 may be used in the manufacture of NAND strings 180 according to some embodiments.

A first embodiment of making a NAND string 180 is illustrated in FIGS. 5A-5E. As illustrated in FIG. 5A, a stack 120 of alternating first material layers 121 and second material layers 122 are provided over a major surface 100a of a substrate 100. In an embodiment, the first material layers 121 comprise an insulating material, such as $SiO_2$, and the second material layers 122 comprise a sacrificial material, such as intrinsic polysilicon or silicon nitride. The method also includes forming a front side opening 81 (e.g. a memory hole) in the stack 120 as illustrated in FIG. 5A. A select gate layer (not shown) is located over the stack 120.

As illustrated in FIG. 5B, a floating gate material is selectively deposited on the exposed surfaces (e.g. edge surfaces) of the second material layers 122 exposed in the openings 81 to form discrete charge storage regions 9, such as floating gates. That is, discrete charge storage regions 9 are not formed on the exposed surfaces of the first material layers 121. In an embodiment, the floating gate material comprises continuous strips or one or more layers of nanoparticles of ruthenium or electrically conductive $RuO_2$.

In an embodiment, the floating gate material is selectively deposited by atomic layer deposition (ALD). The ruthenium and/or $RuO_2$ may be formed by supplying a volatile ruthenium precursor, such as $RuO_4$. One or more $RuO_2$ monolayers may be formed using atomic layer deposition. The one or more $RuO_2$ monolayers may be exposed to a reducing atmosphere to fully or partially reduce the deposited one or more $RuO_2$ monolayers to one or more Ru monolayers. Alternatively, the reducing step may be omitted in all or some cycles if it is desired to form $RuO_2$ or composite Ru+$RuO_2$ floating gates. The $RuO_2$ deposition and Ru reducing steps (i.e., 1 ALD cycle) may be repeated multiple times to form the plurality of discrete charge storage regions. A hydrogen based forming gas, such as 4% hydrogen and 96% nitrogen, may be supplied as the reducing atmosphere for the ruthenium oxide Preferably, the atomic layer deposition is performed by cycling, such as with more than 25 cycles, such as 25-40 cycles, to form continuous strips of Ru and/or $RuO_2$ or less than 25 cycles, e.g. less than 15 cycles to form Ru and/or $RuO_2$ nanoparticles.

Without wishing to be bound by a particular theory, the inventors believe that ruthenium or $RuO_2$ discrete charge storage regions 9 may be selectively deposited using atomic layer deposition on hydrophilic but not on hydrophobic material surfaces. In a non-limiting embodiment, the step of selectively forming the plurality of discrete charge storage regions 9 using atomic layer deposition comprises selectively forming a plurality of at least one of ruthenium or $RuO_2$ discrete charge storage regions 9 using atomic layer deposition in an opening 81 in the stack 120 of alternating hydrophobic first material layers 121 and hydrophilic second material layers 122. At least one of ruthenium or $RuO_2$ discrete charge storage regions are formed on exposed portions (e.g. edge portions) of hydrophilic second material layers 122 but not on exposed portions of hydrophobic first material layers 121, such as $SiO_2$ layers.

ALD is surface sensitive deposition process, i.e., the film growth is strongly dependent on the substrate's surface characteristics. Without wishing to be bound by a particular theory, the inventors believe that the difference in nucleation may be a function of the hydrophobicity of the surfaces, which results in different contact angles for different surfaces. That is, the more hydrophilic the surface, the lower contact angle. Further, a lower contact angle may result in denser films (i.e. denser floating gate segments 9). However, the difference in hydrophobicity may be just one contributing factor in the above described selective deposition. For example, without wishing to be bound by a particular theory, it is believed that differences in the ability of a given surface to initiate catalytic reduction may be another contributing factor in the above described selective deposition. Other factors may also contribute to the selective deposition in addition to or instead of the above mentioned factors.

As illustrated in FIG. 5C, a tunnel dielectric 11 may then be formed in the front side opening 81 over the discrete charge storage regions 9 on the exposed surfaces of the first material layers 121. Next, a channel 1 may be formed over the tunnel dielectric 11.

Next, as illustrated in FIG. 5D, a back side opening 84, such as a trench, is formed in the stack 120. The second material layers 122 are then selectively removed by selective etching via the back side opening 84 to form back side recesses 64. As illustrated in FIG. 5E, a blocking dielectric 7 is formed in the back side opening 84 and the back side recesses 64. The blocking dielectric 7 is conformally deposited in the back side recesses 64. Portions of the blocking dielectric 7 in each of the back side recesses 62 have a clam shape 107 with a vertical portion 107c adjacent the discrete charge storage regions 9 and horizontal portions 107a, 107b adjacent the first material layers 121. A control gate 3 may then be formed in the opening of the clam shaped portion 107 of the blocking dielectric 7, by depositing one or more electrically conductive layers, such as W, TiN, WN, etc., in the back side opening 84 and back side recesses 64 and then removing the electrically conductive layer(s) from the back side opening 84 to leave control gates 3 in the clam shaped portions 107 of the blocking dielectric 7.

FIGS. 6A-6E illustrate another embodiment of making a NAND string 180. In this embodiment, similar to the previous embodiment, a stack 120 of alternating first material layers 121 and second material layers 122 are provided over a major surface 100a of a substrate 100 as illustrated in FIG. 6A. The first material layers 121, may comprise may comprise an oxide, such as $SiO_2$, while the second material layers 122 may comprise intrinsic polysilicon. A front side opening 81 is formed in the stack 120. As illustrated in FIG.

6B, discrete charge storage regions 9 are selectively formed in the front side opening 81 on the exposed surfaces of the second material layers 122.

Next, the first material layers 121 are selectively etched to form front side recesses 62 between adjacent second material layers 122 as illustrated in FIG. 6C. The formation of the front side recesses 62, results in portions of top and bottom surfaces of the second material layers 122 being exposed.

Next, as illustrated in FIG. 6D, the surfaces of the second material layers 122 exposed in the recesses 62 are thermally oxidized to form a dielectric etch stop layer 17 between the discrete charge storage regions 9 and the remaining unoxidized portion 25 of the second material layers 122. The thermal oxidation is preferably performed in an atmosphere containing only water vapor (instead of oxygen gas, $O_2$) as the oxidant, since $H_2O$ generally forms the desired, non-volatile $RuO_2$, while $O_2$ forms undesirable, volatile $RuO_4$ after reacting with the Ru floating gate. Thus, the benefit of using water vapor rather than oxygen gas as a polysilicon oxidant is that water vapor is less likely to form the volatile $RuO_4$ after reacting with Ru. The volatile $RuO_4$ will immediately get removed from the structure and is therefore not desirable. In contrast, $RuO_2$ is non-volatile and stable and will continue to function as a floating gate. Therefore, it is preferred to avoid using oxygen gas for oxidizing polysilicon and all oxygen gas should be removed from the oxidizing ambient to the extent possible (e.g., a trace amount of oxygen gas may still remain if it is not possible to remove it).

Next, as illustrated in FIG. 6E, back side opening 84 is formed in the stack 120. Then, the second material layers 122 are selectively removed through the back side opening 84 to form back side recesses 64 using the etch stop layers 17 as an etch stop. A blocking dielectric 7 is deposited through the back side opening 84, forming a clam shaped dielectric portion 107 in the back side recesses 64, such that the vertical portion 107C of the blocking dielectric 7 contacts the etch stop layer 17. The control gates 3 are formed in the clam shaped dielectric portion 107. In addition, a tunnel dielectric 11 is formed over the discrete charge storage regions 9 and a channel formed over the tunnel dielectric 11 inside the front side opening 81 after forming etch stop layer 17 and before or after forming the back side opening 84.

FIG. 6E illustrates a three-dimensional NAND string 180 made by the above process. The monolithic three dimensional NAND string 180 includes a semiconductor channel 1 in which at least one end portion of the semiconductor channel 1 extends substantially perpendicular to a major surface 100a of the substrate 100. The NAND string 180 includes a plurality of control gate electrodes 3 extending substantially parallel to the major surface 100a of the substrate 100. The plurality of control gate electrodes 3 comprise at least a first control gate electrode 3a located in a first device level and a second control gate electrode 3b located in a second device level located over the major surface 100a of the substrate 100 and below the first device level. The NAND string also includes a blocking dielectric 7 located in contact with the plurality of control gate electrodes 3, a plurality of vertically spaced apart etch stop dielectric strips 17 located in contact with the blocking dielectric 7. The plurality of vertically spaced apart etch stop dielectric strips comprise at least a first spaced apart etch stop dielectric strip 17a located in the first device level and a second spaced apart etch stop dielectric strip 17b located in the second device level. The NAND string 180 also includes a plurality of vertically spaced apart charge storage regions 9 comprising at least one of a metal or an electrically conductive metal oxide and located in contact with the etch stop dielectric strips 17. The plurality of vertically spaced apart charge storage regions 9 comprise at least a first spaced apart charge storage region 9a located in the first device level and a second spaced apart charge storage region 9b located in the second device level. The NAND string also includes a tunnel dielectric 11 located between each one of the plurality of the vertically spaced apart metal charge storage regions 9 and the semiconductor channel 1.

In an embodiment, the plurality of vertically spaced apart etch stop dielectric strips 17 comprise a plurality of silicon oxide strips and the plurality of vertically spaced apart charge storage regions 9 comprise a plurality of at least one of ruthenium or $RuO_2$ strips. A "strip" is a three dimensional configuration in which two of the three dimensions are substantially larger, such as twice or more as large, than the third (e.g. thickness) dimension. In an alternative embodiment, the plurality of vertically spaced apart charge storage regions comprise a plurality of at least one of ruthenium or $RuO_2$ nanoparticles.

FIGS. 7A-7D illustrate another embodiment of making a NAND string 180. As in the previous embodiments, the stack 120 of alternating first material layers 121 and second material layers 122 is provided over the major surface 100a of the substrate 100, as illustrated in FIG. 7A. The first material layers 121, may comprise an oxide, such as $SiO_2$ and the second material layers 122 may comprise intrinsic polysilicon. A front side opening 81 is formed through the stack 120.

Next, as illustrated in FIG. 7B, the second material layers 121 are selectively etched through the front side opening 81 to form shallow front side recesses 62. Then, a first floating gate material is deposited in the front side recesses 62 to form first discrete charge storage regions 9a. In an embodiment, the first floating gate material comprises boron doped polysilicon. The first discrete charge storage regions 9a may be formed by any suitable method, such as selected epitaxial growth (SEG) on exposed portions of polysilicon layers 122 or by depositing a polysilicon layer into the front side opening 81 and front side recesses 62 and etching the polysilicon layer such that only first discrete charge storage regions 9a remain in the front side openings 62.

Next, as illustrated in FIG. 7C, a second floating gate material is selectively deposited on the first discrete charge storage regions 9a to form second discrete charge storage regions 9b (i.e. the second floating gate material does not deposit on the exposed surfaces of the first material layers 121 in the front side opening 81). The second discrete charge storage regions 9b may be made of any suitable material, such as ruthenium. The second discrete charge storage regions 9b may be formed by any suitable method, such as by ALD, as described above.

As illustrated in FIG. 7D, a tunnel dielectric 11 is formed in the front side opening 81 over first and second discrete charge storage regions 9a, 9b. Then, a channel 1 is formed over the tunnel dielectric 11. In addition, a back side opening 84 is formed in the stack 120. Then, the second material layers 122 are removed to form back side recesses 64. The first discrete charge storage regions 9a may act as an etch stop during the selective etching step. A blocking dielectric 7 is then formed in the back side opening 84 and the back side recesses 64. Control gates 3 are then formed in clam shaped portions 107 of the blocking dielectric 7.

FIGS. 8A-8C illustrate another embodiment of making a hybrid NAND string 180. In this embodiment the stack 120 of alternating first material layers 121 and second material layers 122 is provided, as illustrated in FIG. 8A. A front side opening (e.g. memory hole) 81 is formed in the stack 120. A charge storage dielectric layer 105 is formed in the front side opening 81. The charge storage dielectric layer 105 may be formed of any suitable insulating material, such as silicon nitride. Next, a tunnel dielectric 11 is formed over the charge storage dielectric layer 105. A channel 1 is formed over the tunnel dielectric 11.

Next, as illustrated in FIG. 8B, the back side opening 84 is formed in the stack 120. Second material layers 122 are then selectively removed via the back side opening 84 to form back side recesses 64 between adjacent first material layers 122. Charge storage dielectric layer 105 may act as an etch stop in the etching process. Then, discrete charge storage regions 9 are selectively formed in the back side recesses 64. In an embodiment, the step of selectively forming the plurality of discrete charge storage regions 9 using atomic layer deposition comprises selectively forming the plurality of discrete charge storage regions 9a (these are Ru/RuO2 layers, and are conductive floating gates) using atomic layer deposition on exposed portions of the charge storage dielectric layer (which relies on charge trapping for storage) 105 in the back side recesses 64 but not on exposed portions of the first material layers 121 in the back side recesses 64. In an embodiment, the charge storage material may be formed of ruthenium or $RuO_2$. The combination of the dielectric charge trap and floating gate (Ru/RuO2) constitutes a hybrid structure which may perform better than charge storage layers which use either the dielectric charge trap or the conductive floating gates alone.

Next, as illustrated in FIG. 8C, a blocking dielectric 7 is formed in the back side opening 84 and in the back side recesses 64. Control gates 3 and may then be formed in a clam shaped portion 107 of the blocking dielectric 7.

As is shown in FIG. 8C, a monolithic three dimensional NAND string 180 made according to this embodiment includes a semiconductor channel 1 with at least one end portion of the semiconductor channel 1 extending substantially perpendicular to the major surface 100a of the substrate 100. The NAND string 180 also includes a plurality of control gate electrodes 3 extending substantially parallel to the major surface 100a of the substrate 100. The plurality of control gate electrodes 3 comprise at least a first control gate electrode 3a located in a first device level and a second control gate electrode 3b located in a second device level located over the major surface 100a of the substrate 100 and below the first device level. The NAND string 180 also includes a blocking dielectric 7 located in contact with the plurality of control gate electrodes 3, a continuous charge storage dielectric layer 105 and a plurality of vertically spaced apart charge storage regions 9 comprising at least one of ruthenium or $RuO_2$ and located in contact with the continuous charge storage dielectric layer 105. The plurality of vertically spaced apart ruthenium or $RuO_2$ charge storage regions 9 comprise at least a first spaced apart ruthenium or $RuO_2$ charge storage region 9a located in the first device level and a second spaced apart ruthenium or $RuO_2$ charge storage region 9b located in the second device level. The NAND string 180 also includes a tunnel dielectric 11 located between the continuous charge storage dielectric layer 105 and the semiconductor channel 1.

FIGS. 9A-E illustrate another embodiment of making a hybrid NAND string 180. In this embodiment, the stack 120 of alternating first material layers 121 and second material layers 122 is provided, as illustrated in FIG. 9A. In this embodiment, the first material layers 121 may comprise silicon oxide the second material layers 122 may comprise silicon nitride. A front side opening 81 is formed in the stack 120.

An etch stop layer 5 is formed in a front side opening 81 over the exposed surfaces of the first and second material layers 121, 122. In an embodiment, the etch stop layer 5 is $SiO_2$. Other suitable materials may also be used. A charge storage dielectric layer 105 is formed over the etch stop layer 5. A tunnel dielectric 11 is formed over the charge storage dielectric layer 105. A semiconductor channel 1 is formed over the tunnel dielectric 11. In this embodiment, a fill material 2 is formed over the channel 1 in the front side opening 81. The fill material 2 may also be formed in the other embodiments discussed herein.

Next, as illustrated in FIG. 9B, a back side opening 84 is formed in the stack. Then, the second material layers 122 are selectively removed via the back side opening 84 to form back side recesses 64 using the etch stop layer 5 as an etch stop. As illustrated in FIG. 9C, the exposed portion of the etch stop layer 5 in the back of the back side recesses 64 are removed to expose the charge storage dielectric layer 105 in the back side recesses 64. The etch stop layer 5 may be removed with a dilute HF wet etch.

Next, as illustrated in FIG. 9D, charge storage material is selectively deposited on the exposed surface of the charge storage dielectric layer 105 in the back side recesses 64 but not on the exposed portions of the first material layers 121 exposed in the back side recesses 64 to form discrete charge storage regions 9 (e.g. floating gates 9a and 9b in different device levels). In an embodiment, the charge storage material is ruthenium and/or $RuO_2$. Preferably, the charge storage material is deposited by ALD. Because the charge storage dielectric layer 105 is silicon nitride but the first material layers 121 are $SiO_2$, ruthenium is selectively deposited only on the charge storage dielectric layer 105 in the back side recesses 64 via ALD. The combination of the charge storage dielectric layer 105 (e.g., silicon nitride layer) and the adjacent discreet metal or metal oxide floating gates 9a, 9b forms a hybrid structure in the NAND string.

Next, as illustrated in FIG. 9E, a blocking dielectric 7 is deposited in the backside opening 84 and the in the back side recesses 64 such that vertical portion 107C contacts the floating gates 9a, 9b. As in the previous embodiments, the blocking dielectric 7 includes a clam shaped portion 107 in the back side recesses 64. In addition, a barrier layer 4 may be deposited on the blocking dielectric 7, followed by formation of the control gates 3. The barrier layer 4 prevents diffusion of the control gate 3 material into the blocking dielectric 7. In an embodiment, the control gates comprise tungsten and the barrier layer comprises TiN.

FIGS. 10A-10F illustrate another embodiment of making a NAND string 180. In this embodiment the stack 120 of alternating first material layers 121 and second material layers 122 is provided, as illustrated in FIG. 10A. A front side opening 81 is formed in the stack 120. As illustrated in FIG. 10B, the second material layers 122 are selectively etched to form front side recesses 62 in layers 122.

Next, as illustrated in FIG. 10C, a first floating gate material is deposited in the front side recesses 62 via the front side opening 81 to form first discrete charge storage regions 9a. The first floating gate material may be any suitable material, such as boron doped polysilicon deposited using the methods described above with respect to FIG. 7C. Then, a tunnel dielectric 11 is formed over the exposed surfaces of the first material layers 121 and the first discrete charge storage regions 9a in the front side opening 81. A channel 1 is formed over the tunnel dielectric 11.

Next, as illustrated in FIG. 10D, a back side opening 84 is formed in the stack 120. The second layers 122 are then selectively removed via the back side opening 84 to form back side recesses 64 and expose the first discrete charge storage regions 9a in the back side recesses 64. Then, as illustrated in FIG. 10E, a second floating gate material is selectively formed on the exposed surface of the first discrete charge storage regions 9a in the back side recesses 64 to form second discrete charge storage regions 9b. In an embodiment, the second floating gate material comprises ruthenium and/or $RuO_2$ formed by ALD through the back side opening 84. After forming the second discrete charge storage regions 9b, a blocking dielectric 7 is formed in the back side opening 84 and in the back side recesses 64 in contact with second discrete charge storage regions 9b, as illustrated in FIG. 10F. Control gates 3 are then formed in clam shaped portions 107 of the blocking dielectric 7 in the back side recesses 64.

Figure 11B:
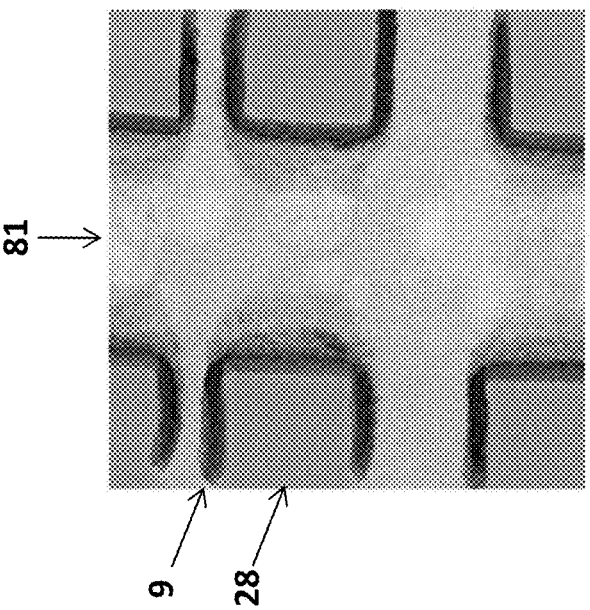
FIG. 11B is a micrograph of a close up of the embodiment illustrated in FIG. 11A.
Figure 11A:
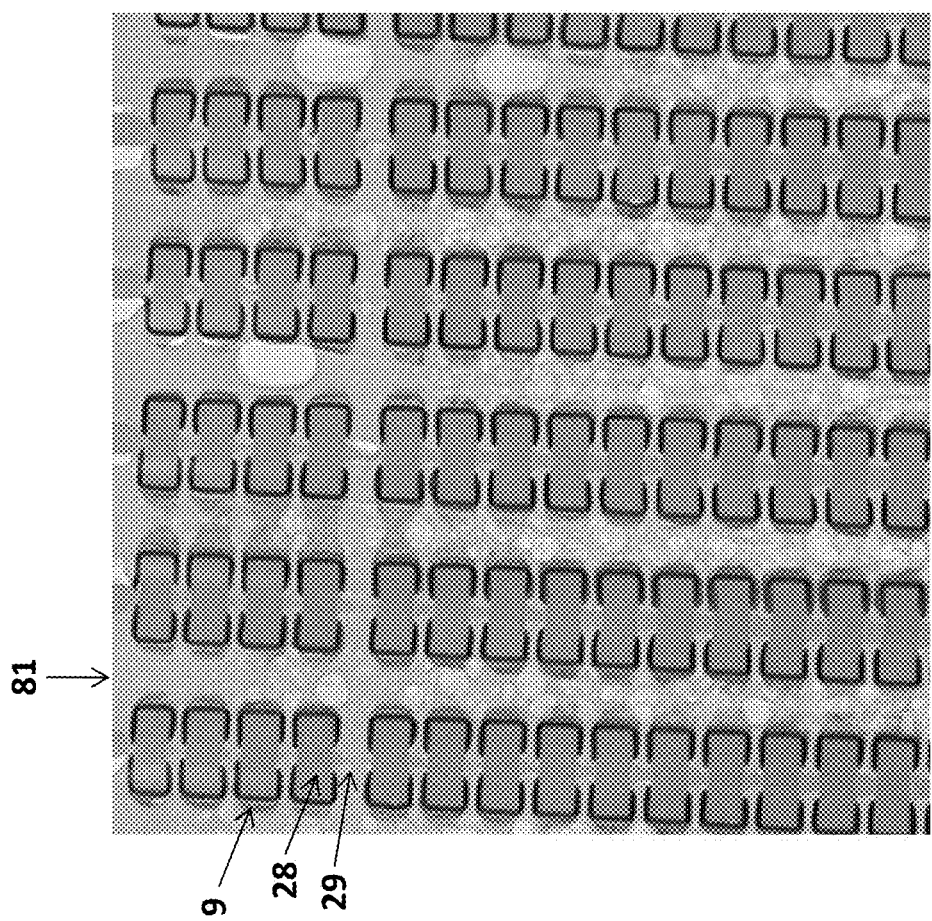
FIG. 11A is a transmission electron microscope (TEM) micrograph illustrating selective conformal coating of a ruthenium floating gate layer on polysilicon layers according to an embodiment. This structure was formed by selectively recessing the oxide layers using a selective wet etch in an OPOP (silicon oxide/polysilicon) stack.

FIGS. 11A, 11B and 11C are TEM micrographs that illustrate the ability to form selective conformal coatings of a ruthenium charge storage layer 9 on polysilicon relative to $SiO_2$. FIG. 11B is a close up of the embodiment illustrated in FIG. 11A. In the embodiment illustrated in FIGS. 11A and 11B, the $SiO_2$ layers 29 are recessed relative to the polysilicon layers 28 by dilute HF dip. This is done to remove any possible surface polymer. As can be seen in FIGS. 11A and 11B, the ruthenium charge storage layer 9 selectively and conformally forms only on the exposed surfaces of the polysilicon layers 28 in the front side opening 81. Also, selectivity is maintained with recessed oxide layers, indicating that selectivity of deposition is not due to surface polymer.

In the embodiment of FIG. 11C, the oxide layers 29 are not recessed and there may be some surface polymer remaining in the opening 81. FIG. 11C shows selective deposition of the ruthenium charge storage layer 9 on the polysilicon layers 28 where the edge surfaces of the polysilicon layers 28 and oxide layers 29 are flush with each other in the opening 81. In other words, it is not necessary to etch back the oxide layers 29 in the OPOP stack in order obtain selective ruthenium deposition on the polysilicon layers 28 even though there could be some surface polymer remaining in the opening 81, as long as the surface polymer does not completely coat the entire sidewalls of the opening.

Figure 12B:
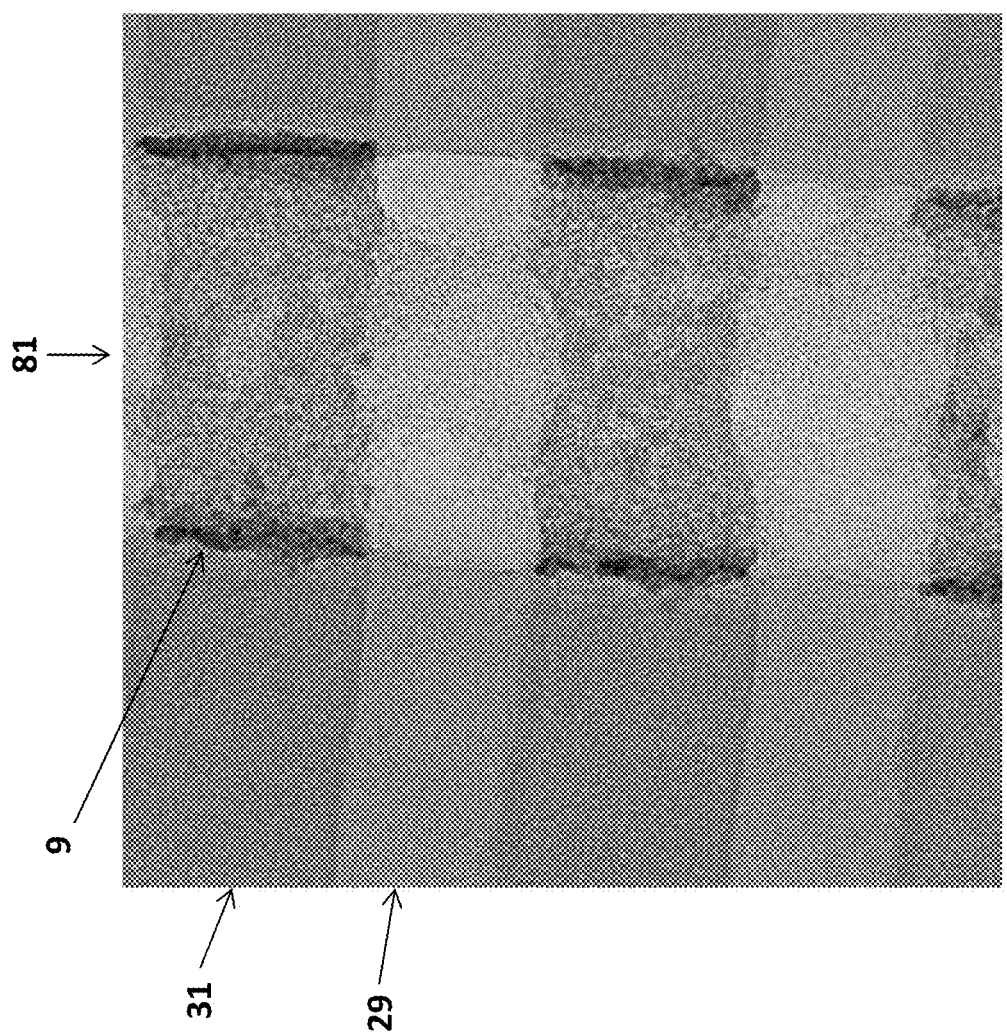

FIGS. 12A and 12B are TEM micrographs illustrating selective conformal coating of a ruthenium floating gate layer 9 on respective recessed and unrecessed edge surfaces of silicon nitride layers 31 in an ONON (silicon oxide 29/silicon nitride 31) stack according to another embodiment. As shown in these FIGS., the ruthenium can also be selectively deposited by ALD on the nitride layers 31 compared to the oxide layers 29.

In the embodiments of FIGS. 5-10, the charge storage regions 9 may comprise metal, metal oxide or metal and metal oxide floating gates including Ru, $RuO_2$ or composite Ru/$RuO_2$ continuous strip or nanoparticle floating gates, based on the number of ALD cycles and whether a reducing step is utilized, as described with respect to FIG. 5B above.

Figure 13A:
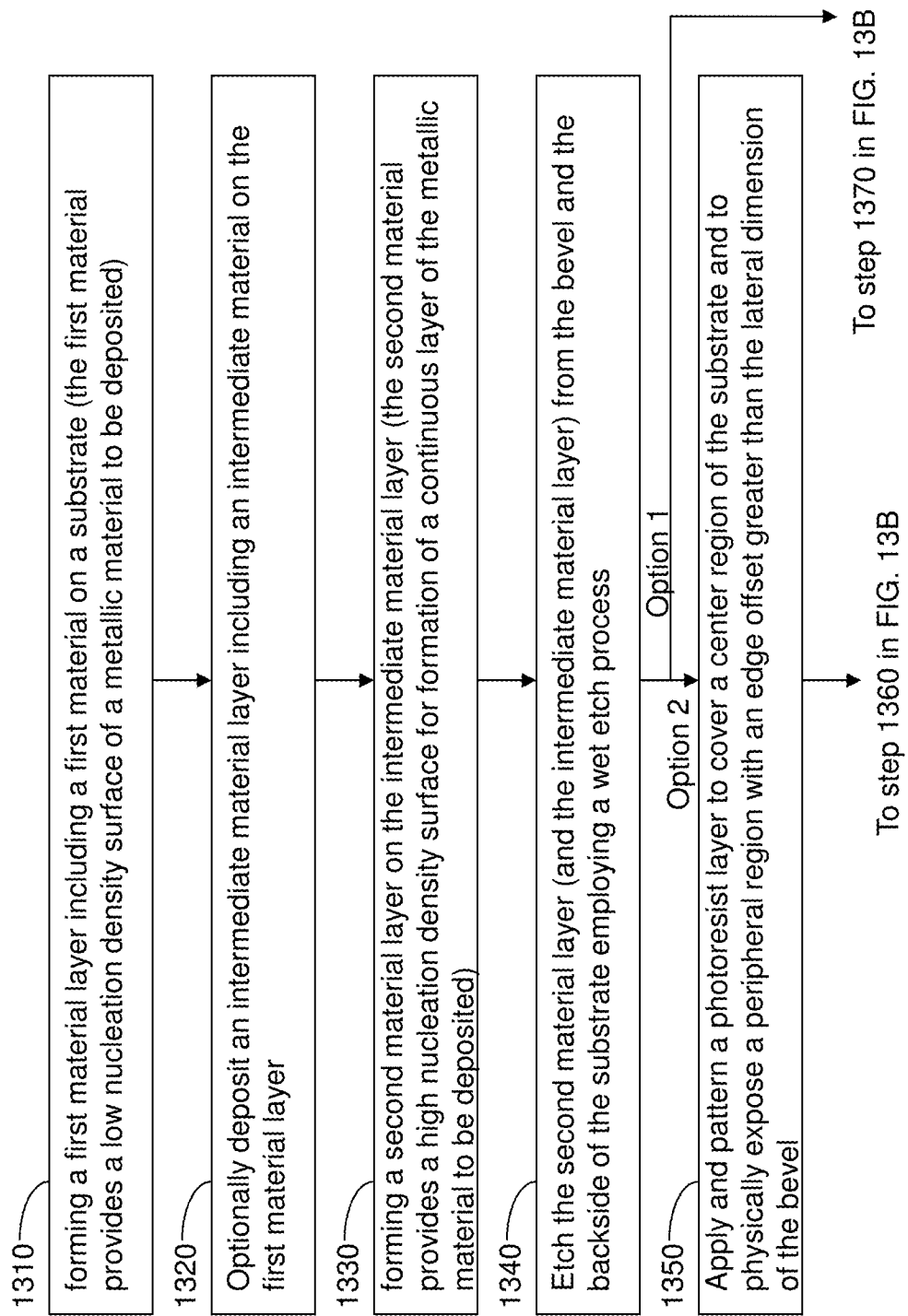
FIGS. 13A and 13B illustrate a flow chart for a sequence of processing steps that can be employed to reduce metal contamination in a process integration scheme that employs a selective metal material deposition process according to an embodiment of the present disclosure.
Figure 13B:
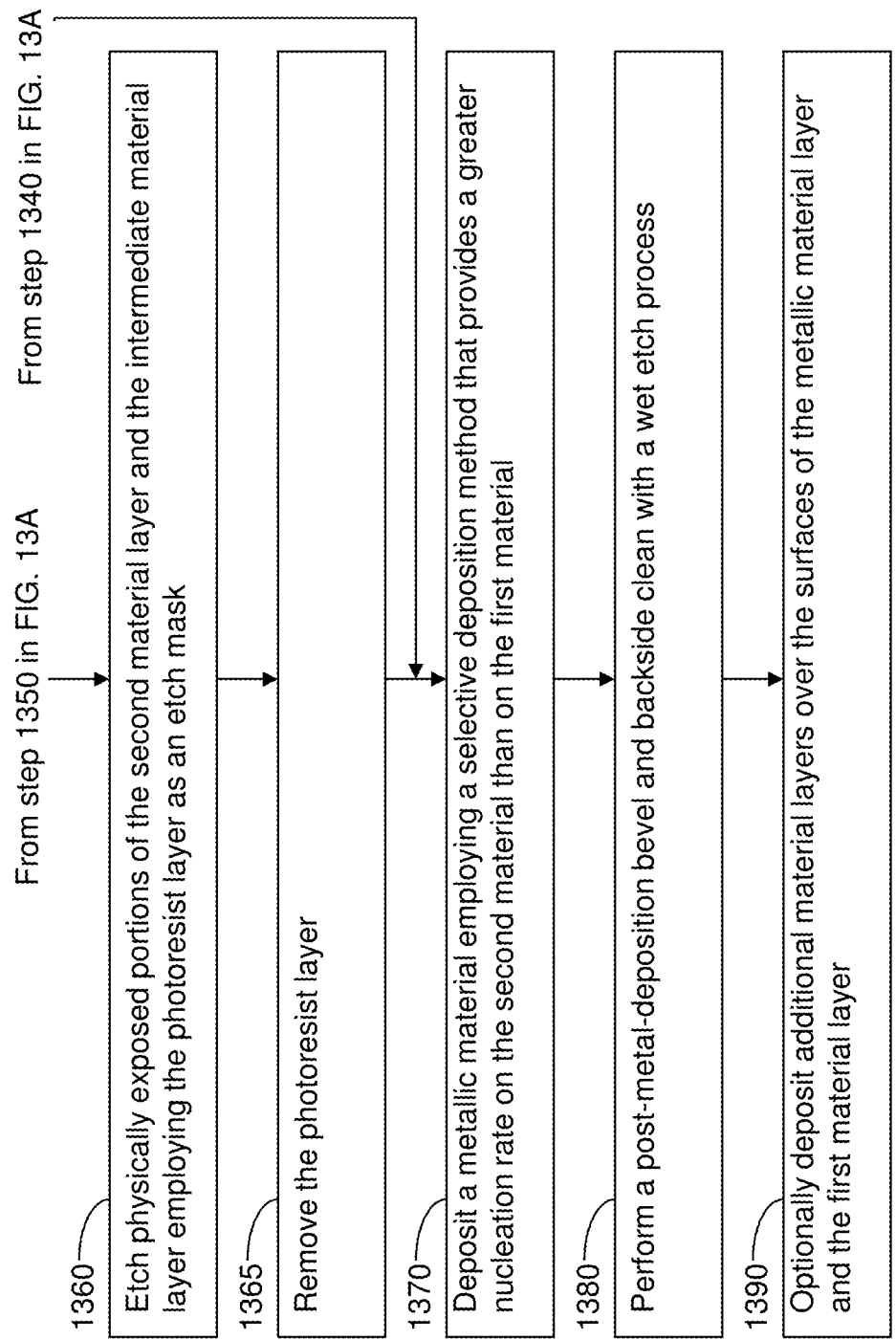

Referring to FIGS. 13A and 13B, a flow chart illustrates an exemplary sequence of processing steps that can be employed to reduce metal contamination in a process integration scheme that employs a selective metal material deposition process according to an embodiment of the present disclosure. FIGS. 14A-14D illustrate a first exemplary process sequence that can be employed to reduce metal contamination from a selective metal material deposition process according to an embodiment of the present disclosure.

Figure 14A:
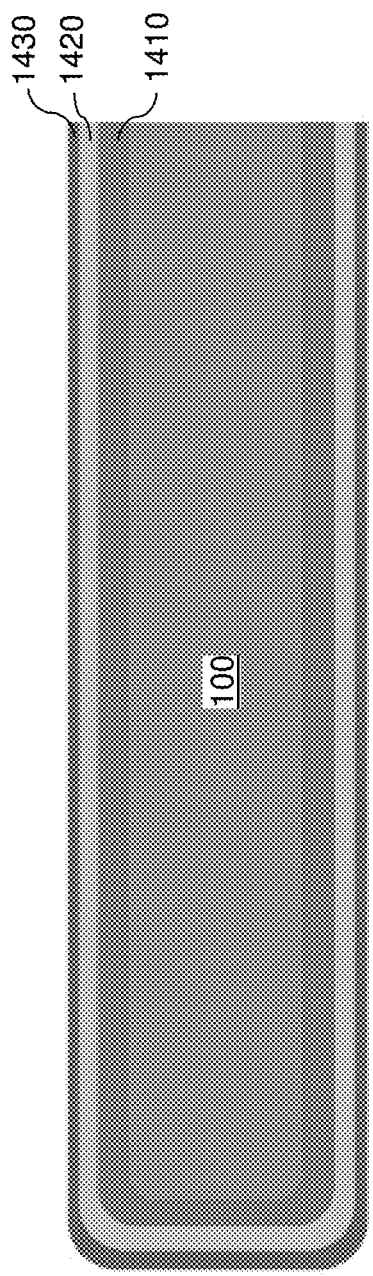
FIGS. 14A-14D illustrate a first exemplary process sequence that can be employed to reduce metal contamination from a selective metal material deposition process according to an embodiment of the present disclosure.

Referring to steps 1310-1330 of FIG. 13A and FIG. 14A, a stack including at least a first material layer 1410 and a second material layer 1430 is formed on a substrate 100, which can be a semiconductor substrate, an insulator substrate, or a conductive substrate. As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous structure that has a thickness less than the thickness of the structure. For example, a layer may be located between any pair of horizontal planes between, or at, a top surface and a bottom surface of the structure. A layer may extend horizontally, vertically, and/or along a tapered surface. A substrate may be a layer, may include one or more layers therein, or may have one or more layer thereupon, thereabove, and/or therebelow.

The substrate 100 can be, for example, a silicon substrate (e.g., single crystal silicon wafer) having a thickness in a range from 0.5 mm to 2.0 mm, and having a diameter in a range from 100 mm to 450 mm, although lesser and greater diameters can also be employed. As used herein, a "semiconductor material" refers to a material having electrical conductivity in the range from $1.0 \times 10^{-6}$ S/cm to $1.0 \times 10^{5}$ S/cm, and is capable of producing a doped material having conductivity resistivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate.

The first material layer 1410 can include a first material, and the second material layer 1430 can include a second material that is different from the first material. In one embodiment, the first material and the second material can be selected to provide different hydrophobicity. In one embodiment, the first material can provide a surface having a first hydrophobicity, and the second material can provide a surface having a second hydrophobicity that is less than the first hydrophobicity. In other words, the first material can provide a surface that is more hydrophobic than a surface of the second material. In one embodiment, the first material can provide a hydrophobic surface, and the second material can provide a hydrophilic surface.

As used herein, a "contact angle" refers to the angle between a liquid surface and a portion of a solid surface underlying the liquid surface at a location at which the liquid surface meets the solid surface. The contact angle quantifies the wettability of a solid surface by the liquid under a given condition. As used herein, a "hydrophobic surface" refers to a surface for which the contact angle for water is greater than 90 degrees. In other words, water tends to ball up on the hydrophobic surface to minimize a contact area. As used herein, a "hydrophilic surface" refers to a surface for which the contact angle for water is less than 90 degrees. The degree of hydrophobicity can be measured by the contact angle for water. In other words, the greater the hydrophobicity of a surface, the greater the contact angle of water for that surface.

In one embodiment, the stack can optionally include an intermediate material layer 1420 comprising an intermediate material. The intermediate material layer 1420 can be formed on the first material layer 1410. In one embodiment, the first material layer 1410, the second material layer 1420, and the third material layer 1430 can be sequentially formed on the substrate 100.

In one embodiment, each of the first material layer 1410, the intermediate material layer 1420, and the second material layer 1430 can be formed on all sides of the substrate 100 including the front side (i.e., a side on which devices such as semiconductor devices are to be subsequently formed) including a first planar surface, the back side including a second planar surface that is parallel to the first planar surface and located on the opposite side of the front side, and bevels that include all surfaces that are not parallel to the first and second planar surfaces. When the substrate 100 is positioned such that the first planar surface faces upward and the second planar surface faces downward. In this case, the first planar surface is referred to as a top surface (e.g., top major surface) of the substrate 100, and the second planar surface is referred to as a bottom surface (e.g., bottom major surface) of the substrate 100. The bevels comprise minor sidewall surface(s) and are adjoined to the first and second planar surfaces at peripheries thereof.

The first material layer 1410, the optional intermediate material layer 1420, and the second material layer 1420 can be sequentially formed over all surfaces of the substrate 100 by suitable deposition methods, which can include chemical vapor deposition, atomic layer deposition, thermal conversion (such as thermal oxidation and/or thermal nitridation), and/or plasma conversion (such as plasma oxidation and/or plasma nitridation).

In one embodiment, the first material of the first material layer 1410 can include silicon oxide, the intermediate material of the intermediate material layer 1420 can include a semiconductor material (such as silicon, a silicon-germanium alloy, and/or a compound semiconductor material) or a conductive material (such as a metal material), and the second material of the second material layer 1430 can include silicon nitride. In one embodiment, the first material layer 1410 can be a tunneling dielectric layer for a floating gate memory device, such as a NAND memory device, the intermediate material layer 1420 can be a semiconductor floating gate material layer, and the second material layer 1430 can be a charge trapping dielectric of a hybrid floating gate/charge trapping dielectric charge storage region in the memory device, such as a hybrid NAND memory device. In one embodiment, the first material layer 1410 can be a silicon oxide layer, the intermediate material layer 1420 can be an amorphous silicon layer or a polysilicon layer, and the second material layer 1430 can be a silicon nitride layer.

In one embodiment, the first material layer 1410 can have a thickness in a range from 1 nm to 30 nm (such as from 1.5 nm to 10 nm), the optional intermediate material layer 1420 can have a thickness in a range from 3 nm to 200 nm (such as from 10 nm to 100 nm), and the second material layer 1430 can have a thickness in a range from 1 nm to 100 nm (such as from 3 nm to 40 nm), although lesser and greater thicknesses can be employed for each of the first material layer 1410, the intermediate material layer 1420, and the third material layer 1430. In one embodiment, the first material layer 1410, the optional intermediate material layer 1420, and the second material layer 1430 can be formed by a conformal deposition method.

In an illustrative example, the first material layer 1410 can be a conformal silicon oxide layer formed by thermal oxidation of surface portions of the substrate 10 (in case the substrate is a silicon substrate), the intermediate material layer 1420 can be a doped amorphous silicon layer or a doped polysilicon layer deposited by chemical vapor deposition, and the second material layer 1430 can be a silicon nitride layer formed by chemical vapor deposition. In such cases, the stack including the first material layer 1410, the optional intermediate material layer 1420, and the second material layer 1430 can be formed on all sides of the substrate 100 including the front side, the back side, and the bevels. If the various material layers (1410, 1420, 1430) in the stack are formed by conformal deposition methods, the thickness of each of the various material layers (1410, 1420, 1430) can be uniform.

The first material of the first material layer 1410 and the second material of the second material layer 1430 are selected such that the surfaces of first material provide low nucleation density surfaces for a metal material to be deposited in a subsequent selective metal material deposition process, and the surfaces of the second material provide high nucleation density surfaces for the metal material to be deposited in the subsequent selective metal material deposition process. The difference between the low nucleation density of the surfaces of the first material and the high nucleation density of the surfaces of the second material can be such that the low nucleation density induces no formation of the metal material or formation of isolated islands of the metal material at best, while the high nucleation density induces formation of a continuous layer of the metal material in the subsequent selective metal material deposition process.

In one embodiment, the differences in the hydrophobicity between the surfaces of the first material and the surfaces of the second material can be the mechanism for inducing the different nucleation characteristics of the metal material to be subsequently deposited. The first material of the first material layer 1410 can be a first dielectric material having a first hydrophobicity (as characterized by the contact angle for the first material), and the second material of the second material layer 1430 can be a second dielectric material having a second hydrophobicity (as characterized by the contact angle for the second material).

Depending on whether the subsequent selective metal material deposition proceeds provides a greater nucleation rate and growth rate on a more hydrophobic surface or on a less hydrophobic surface, the first material and the second material can be selected such that the selective metal material deposition process has a greater nucleation rate and deposition rate on the surfaces of the second material than on the first material. For example, if the subsequent metal deposition process provides a greater nucleation rate and a greater deposition rate on hydrophilic surfaces than on hydrophobic surfaces, the second hydrophobicity of the second dielectric material of the second material layer 1430 can be less than the first hydrophobicity of the first dielectric material of the first dielectric material layer 1410. In this case, the surfaces of the second material layer 1430 is less hydrophobic (i.e., more hydrophilic) than the surfaces of the first material layer 1410. In an illustrative example, the first material layer 1410 can be a silicon oxide layer, and the second material layer 1430 can be a silicon nitride layer.

Alternatively, if the subsequent metal deposition process provides a greater nucleation rate and a greater deposition rate on hydrophobic surfaces than on hydrophilic surfaces, the second hydrophobicity of the second dielectric material of the second material layer 1430 can be greater than the first hydrophobicity of the first dielectric material of the first dielectric material layer 1410. In this case, the surfaces of the second material layer 1430 is more hydrophobic (i.e., less hydrophilic) than the surfaces of the first material layer 1410. In an illustrative example, the first material layer 1410 can be a silicon nitride layer, and the second material layer 1430 can be a silicon oxide layer.

Figure 14B:
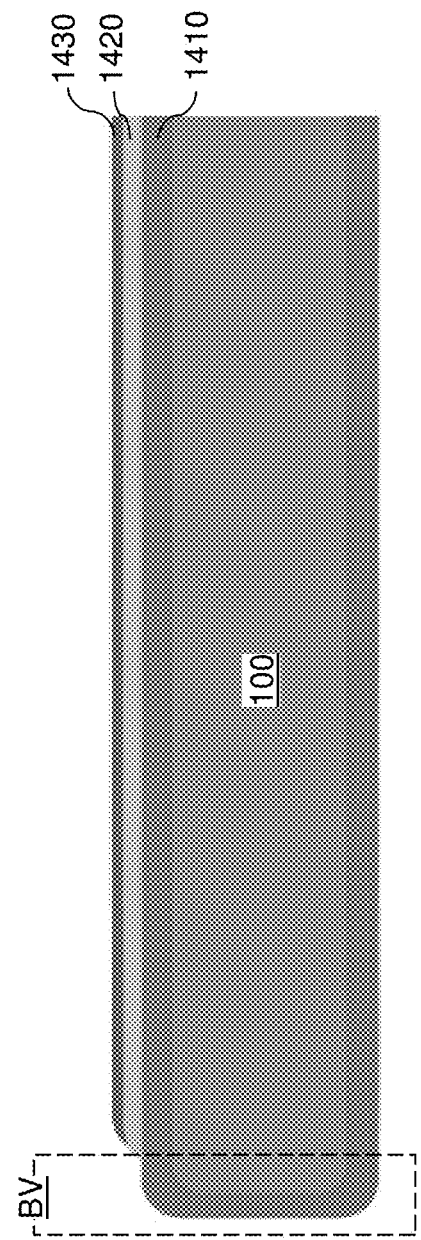

Referring to step 1340 of FIG. 13A and FIG. 14B, the second material layer 1430 and the optional intermediate material layer 1420 can be etched from the bevels BV and the backside of the substrate 10, while the portions of the second material layer 1430 and the optional intermediate material layer 1420 overlying the front surface of the substrate 100 are not etched. Such area-controlled etching of the second material layer 1430 and the optional intermediate material layer 1420 can be performed by employing a wet etch process. For example, a single wafer wet etch processing tool (also known as a single-wafer wet clean tool) can be employed to perform the area-controlled wet etch process. The single wafer wet etch processing tool can spray a wet etch chemical (an etchant chemical in the form of a liquid) from a nozzle, which can direct the wet etch chemical to peripheral regions of the substrate 100. Examples of single wafer wet etch processing tools include Da Vinci® by Lam Research Corporation™, DV-Prime® by Lam Research Corporation™, and Orion® by FSI International™.

A single wafer wet etch processing tool can typically spray a wet etch chemical within a predefined peripheral region of a substrate 100. The peripheral region can be an annular region within a predefined distance from the edge of the substrate 100. The predefined distance is herein referred to as an edge removal distance, which can be in a range from 1 mm to 3 mm, although lesser and greater distances can also be employed. The wet etch chemical can be sprayed into the peripheral region of the substrate 100 as the substrate 100 spins around a center axis passing through the center of mass the substrate 100 and extending along a direction that is perpendicular to the front and back surfaces of the substrate 100.

In addition, a single wafer wet etch processing tool can typically spray the wet etch chemical to the backside of each substrate 100 to remove the materials of the second material layer 1430 and the intermediate material layer 1420. The removal of the portion of the second and intermediate material layers (1420, 1430) from the back side of the substrate 100 and from the bevels of the substrate 100 may be performed simultaneously, or may be performed sequentially.

In one embodiment, removal of etched portions of the second material layer 1430 can be performed prior to removal of etched portions of the intermediate material layer 1420. In this case, a first etchant that removes the second material of the second material layer 1430 can be applied to the bevels and to the back side of the substrate 100 in a first wet etch process. Subsequently, a second etchant that removes the intermediate material of the intermediate material layer 1420 can be applied to the bevels and to the back side of the substrate in a second wet etch process. For example, if the second material layer 1430 comprises silicon nitride and if the intermediate material layer 1420 comprises amorphous or polycrystalline silicon, the first wet etch process can employ hydrofluoric acid (e.g., 49% HF) or phosphoric acid as the first etchant and the second wet etch process can employ a room temperature TMY (i.e., trimethyl-2 hydroxyethyl-ammonium hydroxide) solution, a KOH solution or NaOH solution as the second etchant. If HF is used as the first etchant, then the intermediate material layer 1420 protects the underlying silicon oxide layer 1410 from being etched during etching of layer 1430.

Alternatively, removal of portions of the etched portions of the second material layer 1430 can be performed concurrently with removal of etched portions of the intermediate material layer 1420. In this case, a common etchant that removes the second material of the second material layer 1430 and the intermediate material of the intermediate material layer 1420 can be applied to the bevels and to the back side of the substrate in a single wet etch process. In one embodiment, the common etchant can be a mixture of a first etchant that etches the second material and a second etchant that etches the intermediate material.

In one embodiment, the removal of the second material of the second material layer 1430 can be selective to the first material of the first material layer 1410. As used herein, removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The selectivity of the etch process that removes the second material of the second material layer 1430 can be at least 3, can be at least 5, or can be at least 10 with respect to the first material of the first material layer 1410.

If the intermediate material layer 1420 is present, the intermediate material layer 1420 can be removed from the bevels and the back side of the substrate 100 without removing the portions of the intermediate material layer 1420 overlying the top surface of the substrate 100, i.e., without removing the intermediate material layer 1420 from the front side of the substrate 100. In one embodiment, the removal of the intermediate material of the intermediate material layer 1420 can be selective to the first material of the first material layer 1410. The selectivity of the etch process that removes the intermediate material of the intermediate material layer 1420 can be at least 3, can be at least 5, or can be at least 10 with respect to the first material of the first material layer 1410.

Step 1350 of FIG. 13A and steps 1360 and 1365 of FIG. 13B are optional steps that may be omitted, or may be performed in various embodiments of the present disclosure, as will be described with respect to FIGS. 15D-15F below. In one embodiment, step 1350 of FIG. 13A and steps 1360 and 1365 of FIG. 13B may be omitted, and the process flow can proceed according to option 1 in FIG. 13A to step 1370 of FIG. 13B, which is schematically illustrated in FIG. 14C.

Figure 14C:
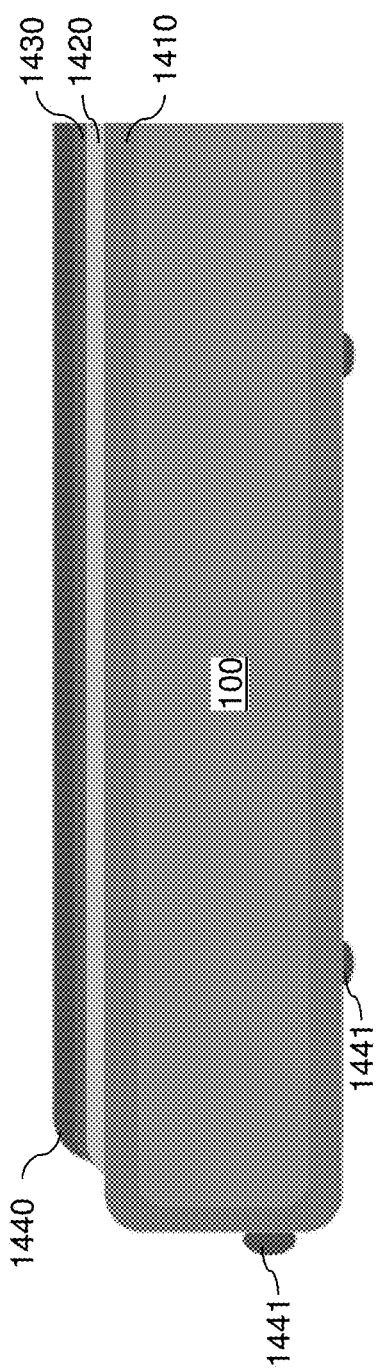

Referring to step 1370 of FIG. 13B and FIG. 14C, a selective metal deposition process can be performed to deposit a metal material as a metal material layer 1440 on the surface of the second material layer 1430, while the metal material is not deposited as a material portion on the surfaces of the first material layer 1410. Thus, the selective metal deposition process provides differential nucleation rates and differential deposition rates between the first dielectric surfaces of the first material layer 1410 and the second dielectric surfaces of the second material layer 1430. The basis of the differential nucleation rates and differential deposition rates can be the differences in the hydrophobicity of the surfaces of the first and second material layers as discussed above.

In one embodiment, the surfaces of the first material layer 1410 (which are herein referred to as first dielectric surfaces) and surfaces of the second material layer 1430 (which are herein referred to as second dielectric surfaces) can provide differential nucleation densities during the selective metal deposition process such that the nucleation density of the metal material on the surfaces of the second material layer 1430 is at least one order of magnitude greater than the nucleation density of the metal material on the surfaces of the first material layer 1410.

As used herein, a "nucleation density" is the density of nucleated clusters of the deposited material that attain a critical size above which decomposition of the nucleated clusters is unlikely, e.g., has a probability less than 1 in 1,000 as measured within a unit area (for example, per mm$^2$) and within a unit time (for example, per second). The nucleation density is a function of the process conditions employed for the selective metal deposition process. However, the ratio between the nucleation density on the surfaces of the second material layer 1430 to the nucleation density on the surfaces of the first material layer 1410 can be a fairly slowly varying function of the process conditions employed for the selective metal deposition process.

In one embodiment, the ratio of the nucleation density on the surfaces of the second material layer 1430 to the nucleation density on the surfaces of the first material layer 1410 can be greater than 10. In one embodiment, the ratio of the nucleation density on the surfaces of the second material layer 1430 to the nucleation density on the surfaces of the first material layer 1410 can be greater than 1,000. In one embodiment, the ratio of the nucleation density on the surfaces of the second material layer 1430 to the nucleation density on the surfaces of the first material layer 1410 can be greater than 1,000,000. In one embodiment, the ratio of the nucleation density on the surfaces of the second material layer 1430 to the nucleation density on the surfaces of the first material layer 1410 can be greater than 1,000,000,000. In one embodiment, the ratio of the nucleation density on the surfaces of the second material layer 1430 to the nucleation density on the surfaces of the first material layer 1410 can be in a range from 10 to 10$^{24}$, such as from 100 to one million. In one embodiment, the ratio of the nucleation density on the surfaces of the second material layer 1430 to the nucleation density on the surfaces of the first material layer 1410 can be primarily determined by the defect density on the surfaces of the first material layer. In other words, nucleation of the metal material may not occur unless a defect is present on the surfaces of the first material layer 1410.

In one embodiment, the selective metal material deposition process can be a function of the hydrophobicity (which may be measured by the contact angle of a water droplet on a surface). In one embodiment, the selective metal material deposition process can provide a higher nucleation density and a higher deposition rate on surfaces having a lower hydrophobicity than on surfaces having a higher hydrophobicity. In one embodiment, the first material layer 1410 may be hydrophobic, and the second material layer 1430 may be hydrophilic. For example, the first material layer 1410 can include a silicon oxide layer, and the second material layer 1430 can include a silicon nitride layer. In another embodiment, the first and second material layers (1410, 1430) may be both hydrophobic and the first material layer 1410 may be more hydrophobic than the second material layer 1430. In yet another embodiment, the first and second material layers (1410, 1430) may be both hydrophobic and the second material layer 1430 may be more hydrophilic than the first material layer 1410. As used herein, the nucleation rate of a material layer refers to the nucleation rate of a planar (i.e., flat) surface of the material layer.

The differences in the nucleation rates between the first and second material layers (1410, 1430) can cause the metal material to be deposited as at least one continuous layer (i.e., a material portion) on the second material layer 1430, while preventing deposition of the metal material on the surfaces of the first material layer 1410 or inducing formation of the metal material as isolated islands 1441 on the first material layer 1410. As used herein, isolated islands refer to material portions that are located on a surface having a same composition throughout and not interconnected with among one another.

The thickness of the metal material layer 1440 can be in a range from 0.5 nm to 20 nm, such as 3 nm to 10 nm, such as about 5 nm to 6 nm, although lesser and greater thicknesses can also be employed. The isolated islands 1441 have a maximum dimension not greater than the thickness of the continuous layer of the deposited metal material, i.e., the thickness of the metal material layer 1440. In one embodiment, the isolated islands 1441 can have a maximum dimension that is not greater than ⅕ of the thickness of the metal material layer 1440 at the time of termination of the selective metal material deposition process. In one embodiment, the isolated islands 1441 can have a maximum dimension that is not greater than ⅒ of the thickness of the metal material layer 1440 at the time of termination of the selective metal material deposition process. In one embodiment, the isolated islands 1441 can have a maximum dimension that is not greater than ½₀ of the thickness of the metal material layer 1440 at the time of termination of the selective metal material deposition process. In one embodiment, the isolated islands 1441 can have a maximum dimension that is not greater than 5 nm (e.g., 0.1 to 5 nm), and may have a maximum dimension not greater than 3 nm, at the time of termination of the selective metal material deposition process. In one embodiment, the selective metal deposition process can be terminated when the isolated islands 1441 of the metal material has a maximum dimension not greater than 5 nm.

In one embodiment, the selective metal material deposition process can be a conformal deposition process. In other words, the thickness of the deposited metal material in areas where deposition of the metal material occurs can be uniform throughout the areas of deposition. In one embodiment, the selective metal material deposition process can employ an atomic layer deposition process.

In a non-limiting illustrative example, the atomic layer deposition process can employ a metal oxide precursor gas, and the metal material can be deposited by reduction of adsorbed molecules of the metal oxide precursor gas by a reducing gas such as hydrogen, silane, and/or diborane. For example, the atomic layer deposition process can employ $RuO_4$ as a precursor gas or any other suitable precursor gas, the metal material can be ruthenium deposited by reduction of adsorbed molecules of $RuO_4$.

In one embodiment, the atomic layer deposition process for selective deposition of ruthenium can be the same as the atomic layer deposition process for depositing portions of ruthenium as described above. For example, the atomic layer deposition process for selective deposition of the metal material layer 1440 may be the same as any of the processes employed to form the second material layers 122 including ruthenium illustrated in FIGS. 5B and 5C, the plurality of vertically spaced apart charge storage regions 9 as illustrated in FIGS. 6B-6E, the second discrete charge storage regions 9b as illustrated in FIGS. 7C and 7D, the discrete charge storage regions 9 as illustrated in FIGS. 8B and 8C, the discrete charge storage regions 9 as illustrated in FIGS. 9D and 9E, the second discrete charge storage regions 9b as illustrated in FIGS. 10E and 10F, the ruthenium charge storage layer 9 as illustrated in FIG. 11A-11C, or the ruthenium floating gate layer 9 as illustrated in FIGS. 12A and 12B.

The isolated islands 1441 may, or may not, be formed on the surfaces of the first material layer 1410. The isolated islands 1441 of the metal material do not physically contact one another, and do not form an electrically conductive path. At any rate, the isolated islands 1441, even if present, do not cover, or contact, more than 1% (e.g., 0.0000001 to 1%) of the surface of the physically exposed surface of the first material layer. In one embodiment, the deposited metal material covers less than 0.1% of the surface of the physically exposed surface of the first material layer. In one embodiment, the deposited metal material covers less than 0.01% of the surface of the physically exposed surface of the first material layer. In one embodiment, the deposited metal material covers less than 0.001% of the surface of the physically exposed surface of the first material layer. In one embodiment, the deposited metal material covers less than 0.00001% of the surface of the physically exposed surface of the first material layer. In one embodiment, the deposited metal material covers less than 0.000001% of the surface of the physically exposed surface of the first material layer.

Alternatively, the selective metal material deposition process can provide a higher nucleation density and a higher deposition rate on surfaces having a higher hydrophobicity than on surfaces having a lower hydrophobicity. In one embodiment, the first material layer 1410 may be hydrophilic, and the second material layer 1430 may be hydrophobic. For example, the first material layer 1410 can include a silicon nitride layer, and the second material layer 1430 can include a silicon oxide layer. In another embodiment, the first and second material layers (1410, 1430) may be both hydrophobic and the first material layer 1410 may be less hydrophobic than the second material layer 1410. In yet another embodiment, the first and second material layers (1410, 1430) may be both hydrophobic and the second material layer 1430 may be less hydrophilic than the first material layer 1410.

The thickness of the metal material layer 1440 can be in a range from 3 nm to 2,000 nm, although lesser and greater thicknesses can also be employed. In one embodiment, the thickness of the metal material layer 1440 can be selected such that patterned portions of the metal material layer 1440 can have a suitable thickness as at least portions of floating gate structures. For example, the thickness of the metal material layer 1440 can be in a range from 0.5 nm to 20 nm, such as 3 nm to 10 nm, such as about 5 nm to 6 nm, although lesser and greater thicknesses can also be employed.

In case the intermediate material layer 1420 is present, the metal material may, or may not, grow from the physically exposed sidewall surfaces of the intermediate material layer 1420. In one embodiment, peripheral portions of the metal material layer 1440 may grow from the sidewalls of the intermediate material layer 1420. Alternatively, isolated islands 1441 of the metal material may nucleate on the sidewalls of the intermediate material layer 1420. In one embodiment, the nature of growth of the metal material on the sidewalls of the intermediate material layer 1420 may be determined by the hydrophobicity of the physically exposed surfaces of the intermediate material layer 1420.

Figure 14D:
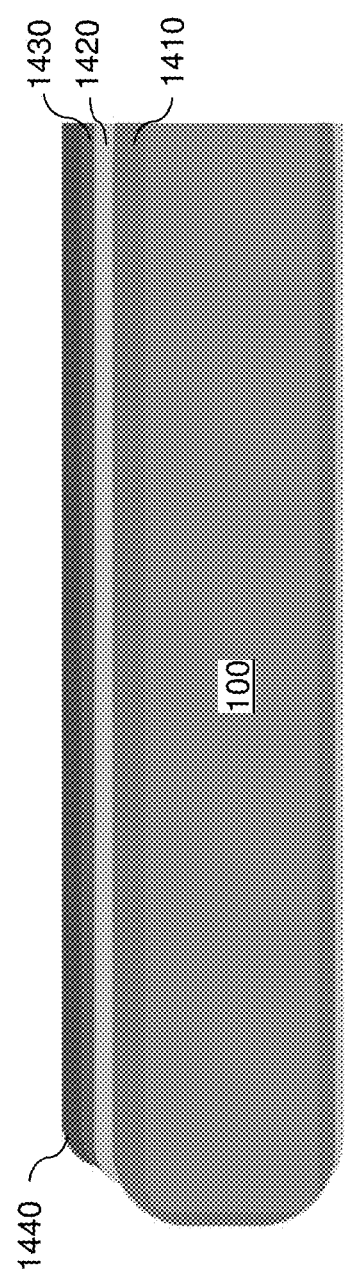

Referring to step 1380 of FIG. 13B and FIG. 14D, another wet etch process can be performed to remove the isolated islands 1441 of the deposited metal material from the bevels and the back side of the substrate 100, while not removing the at least one layer of the metal material, i.e., the metal material layer 1440, from above the top surface of the substrate 100. This wet etch process is herein referred to as a post-metal-deposition wet etch process, and can provide surfaces that are free of metal contamination, i.e., free of isolated islands 1441 of the metal material, on the bevels and the back side of the substrate. The wet etch process can apply a wet etchant chemical to the bevels and to the back side of the substrate.

In one embodiment, the isolated islands 1441 can be etched from the bevels BV and the backside of the substrate 10, while the portions of the metal material layer 1440 overlying the second material layer 1430 are not etched. Such area-controlled etching of the isolated islands 1441 can be performed by employing a wet etch process. For example, a single wafer wet etch processing tool of the same type as employed for area-controlled etching of the second material layer 1430 and the intermediate material layer 1420 at step 1340 of FIG. 13A can be employed to perform the area-controlled wet etch process that removes the isolated islands 1441 of the metal material. The single wafer wet etch processing tool can spray a wet etch chemical (an etchant chemical in the form of a liquid) from a nozzle, which can direct the wet etch chemical to peripheral regions (i.e., the bevels) and the back side of the substrate 100.

The peripheral region into which the etchant for the isolated islands 1441 of the metal material can be an annular region within a predefined distance from the edge of the substrate 100. The predefined distance is herein referred to as an edge removal distance, which can be in a range from 2 mm to 5 mm, although lesser and greater distances can also be employed. The wet etch chemical can be sprayed into the peripheral region of the substrate 100 as the substrate 100 spins around a center axis passing through the center of mass the substrate 100 and extending along a direction that is perpendicular to the front and back surfaces of the substrate 100. In case the isolated islands 1441 of the metal material include ruthenium, the etchant can be, for example, a solution including nitric acid, ceric ammonium nitrate, potassium hydroxide, or a combination thereof.

In one embodiment, the wet etch process that etches the isolated islands 1441 of the metal material can collaterally etch the first material of the first material layer 1410 from the bevels and the back side of the substrate 100. In one embodiment, a hydrofluoric acid etch lifts off ruthenium islands from the silicon oxide layer 1410 in addition to etching a portion of the layer 1410 thickness. In other embodiment, the removal of the isolated islands 1441 of the metal material may be accelerated by employing an etchant that includes a first component that etches the metal material of the isolated islands 1441 and a second component that etches the first material of the first material layer 1410. For example, if the isolated islands 1441 of the metal material include ruthenium and the first material layer 1410 includes silicon oxide, the etchant can include nitric acid, ceric ammonium nitrate, potassium hydroxide, or a combination thereof as the first component that accounts for more than 90% (such as more than 95%) of the solution in molar percentage, and hydrofluoric acid as the second component that accounts for less than 10% (such as less than 5%) of the solution in molar percentage. In this case, the first material of the first material layer 1410 can be partially or fully etched from the bevels and the back side of the substrate 100, and the isolated islands 1441 of the metal material can be dislodged from any remaining portion of the first material layer 1410 as the matrix material (the first material) in which the isolated islands 1441 are embedded becomes etched around the isolated islands 1441.

In one embodiment, the wet etch process that etches the isolated islands 141 can be selective to the second material of the second material layer 1430, i.e., does not etch the second material in any significant manner. In this case, undercut of the peripheral portion of the metal material layer 1440 can be avoided even if the etchant is applied to sidewalls of the second material layer 1430 during the wet etch process.

Referring to step 1390 of FIG. 13B, additional material layers can be optionally deposited over the surfaces of the metal material layer 1440. In one embodiment, the additional material layers can include a blocking dielectric layer and control gate conductive layer, as will be described below with respect to FIG. 16F. In this case, the substrate 100 comprises a channel of a memory device, layer 1410 comprises a tunnel dielectric of the memory device, and layers 1420, 1430 and 1440 comprise a hybrid charge storage region of the memory device which includes a semiconductor floating gate layer 1420, a charge trapping dielectric layer 1430 and a metal charge storage capping layer 1440.

Referring to FIGS. 15A-15F, another exemplary structure is employed during a second exemplary process sequence, which can be employed to reduce metal contamination from a selective metal material deposition process according to an embodiment of the present disclosure. The second exemplary process sequence can include steps 1310-1380 of FIGS. 13A and 13B, including option 2 steps 1350, 1360 and 1365, and can include step 1390 of FIG. 13B.

Referring to FIG. 15A and steps 1310, 1320, and 1330 of FIG. 13A, the processing steps employed to form the exemplary structure of FIG. 14A can be performed. A stack including a first material layer 1410 including a first material, an optional intermediate material layer 1420 including an intermediate material, and a second material layer 1420 including a second material can be formed on the front side and the back side of the substrate as in the exemplary structure of FIG. 15A.

Referring to FIG. 15B and step 1340 of FIG. 13A, the second material layer 1430 can be etched from the bevels and the backside of the substrate 10, while the portion of the second material layer 1430 overlying the front surface of the substrate 100 is not etched. Such area-controlled etching of the second material layer 1430 can be performed by employing a wet etch process such as the wet etch process employed to remove the second material layer 1430 at the processing step of FIG. 14B. For example, a single wafer wet etch processing tool can be employed to perform the area-controlled wet etch process. The single wafer wet etch processing tool can spray a wet etch chemical (an etchant chemical in the form of a liquid) from a nozzle, which can direct the wet etch chemical to peripheral regions and to the back side of the substrate 100.

A single wafer wet etch processing tool can typically spray a wet etch chemical within a predefined peripheral region of a substrate 100. The peripheral region can be an annular region within a predefined distance from the edge of the substrate 100, which is herein referred to as a first edge removal distance ERD1. The first edge removal distance ERD1 is greater than the width of the bevels BV, and can be in a range from 1 mm to 3 mm, although lesser and greater distances can also be employed. The wet etch chemical can be sprayed into the peripheral region and the back side of the substrate 100 as the substrate 100 spins around a center axis passing through the center of mass the substrate 100 and extending along a direction that is perpendicular to the front and back surfaces of the substrate 100. The removal of the peripheral portion of the second material layer 1430 and the removal of the backside portion of the second material layer 1430 may be performed simultaneously or sequentially.

In one embodiment, the removal of the second material of the second material layer 1430 can be selective to the intermediate material of the intermediate material layer 1420. The selectivity of the etch process that removes the second material of the second material layer 1430 can be at least 3, can be at least 5, or can be at least 10 with respect to the intermediate material of the intermediate material layer 1420.

Figure 15C:
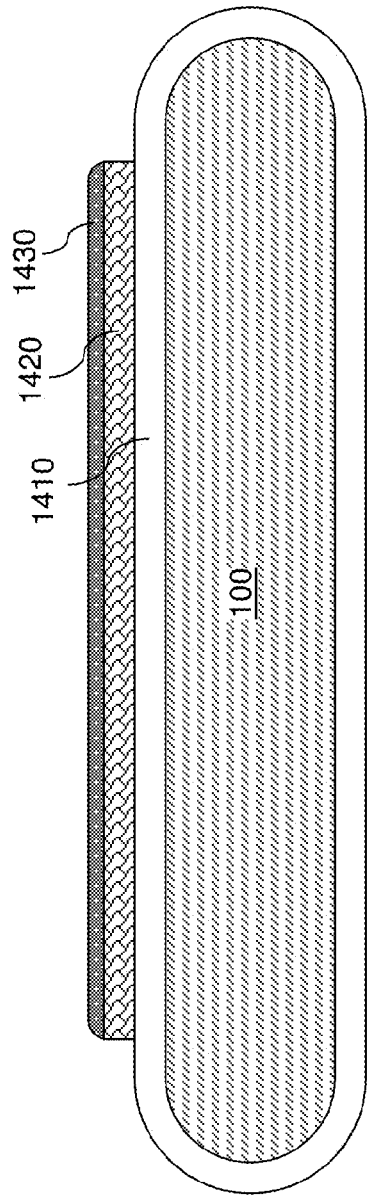

Referring to FIG. 15C and still referring to step 1340 of FIG. 13A, the intermediate material layer 1420 can be removed from the bevels and the back side of the substrate 100 without removing the portions of the intermediate material layer 1420 overlying the top surface of the substrate 100, i.e., without removing the intermediate material layer 1420 from the front side of the substrate 100. A single wafer wet etch processing tool can be employed to perform the area-controlled wet etch process at this processing step. The single wafer wet etch processing tool can spray a wet etch chemical (an etchant chemical in the form of a liquid) from a nozzle, which can direct the wet etch chemical to peripheral regions and/or to the back side of the substrate 100.

A single wafer wet etch processing tool can typically spray a wet etch chemical within the peripheral region of a substrate 100, which is less than the first edge removal distance ERD1 away from the edge of the substrate 100. The wet etch chemical can be sprayed into the peripheral region and the back side of the substrate 100 as the substrate 100 spins around a center axis passing through the center of mass the substrate 100 and extending along a direction that is perpendicular to the front and back surfaces of the substrate 100. The removal of the peripheral portion of the intermediate material layer 1420 and the removal of the backside portion of the intermediate material layer 1420 may be performed simultaneously or sequentially.

In one embodiment, the removal of the intermediate material of the intermediate material layer 1420 can be selective to the first material of the first material layer 1410. The selectivity of the etch process that removes the intermediate material of the intermediate material layer 1420 can be at least 3, can be at least 5, or can be at least 10 with respect to the first material of the first material layer 1410.

While an embodiment employing a set of two sequential wet etch processes to etch the second material layer is described herein, embodiments are expressly contemplated herein in which removal of portions of the etched portions of the second material layer 1430 is performed concurrently with removal of etched portions of the intermediate material layer 1420. In this case, a common etchant that removes the second material of the second material layer 1430 and the intermediate material of the intermediate material layer 1420 can be applied to the bevels and to the back side of the substrate in a single wet etch process. In one embodiment, the common etchant can be a mixture of a first etchant that etches the second material and a second etchant that etches the intermediate material.

Figure 15D:
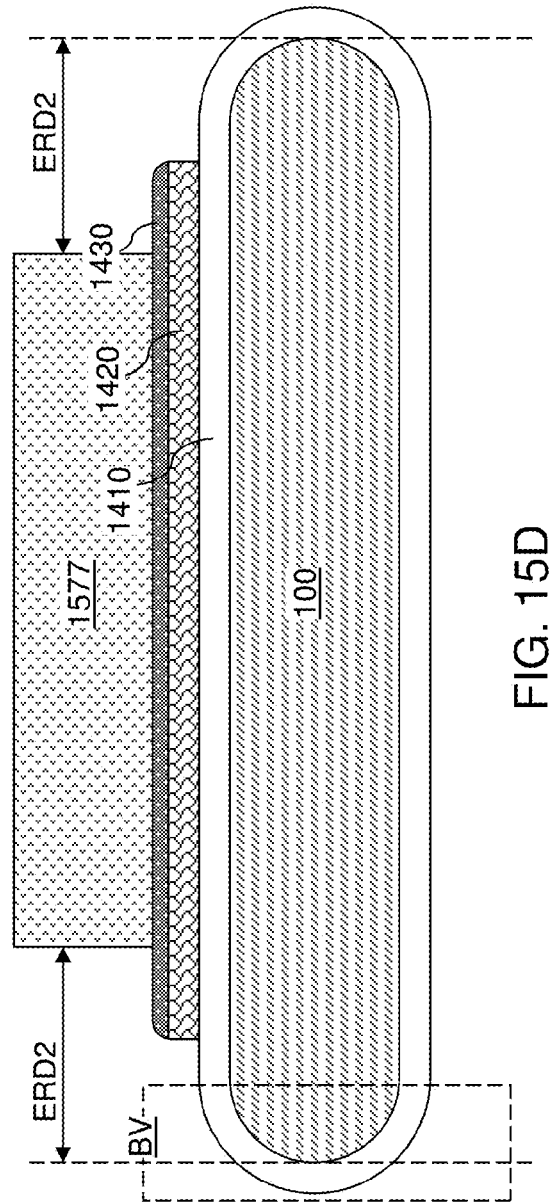

Referring to FIG. 15D and step 1350 of FIG. 13A, a photoresist layer 1577 can be applied over the second material layer 1430, for example, by spin coating. The photoresist layer 1577 can be subsequently patterned employing lithographic methods, i.e., by a combination of lithographic exposure and development. The remaining portion of the photoresist layer 1577 after development covers a center region of the substrate 100. The photoresist layer 1577 is patterned to remove portions of the photoresist layer 1577 from regions overlying the bevels. A peripheral portion of the second material layer 1430 is physically exposed in proximity to the bevels. The sidewall of the photoresist layer 1577 can be formed with an edge offset greater than the width of the bevels BV. Thus, a sidewall of the patterned photoresist layer 1577 can be laterally offset from an outermost edge of the substrate 100 by a uniform offset distance that is greater than the width of the bevels. The edge offset of a sidewall of the photoresist layer 1577 is measured from the outermost edge of the substrate 100, and is herein referred to as a second edge removal distance ERD2. In one embodiment, the second edge removal distance ERDs can be in a range from 3 mm to 5 mm, although lesser and greater distances can also be employed. Preferably, distance ERD2 is greater than distance ERD1 to expose edge portions of layer 1430 outside of layer 1577.

Referring to FIG. 15E and step 1360 of FIG. 13B, physically exposed portions of the second material layer 1430 and the intermediate material layer 1420 (if present) that do not underlie the photoresist layer 1577 can be removed by an etch process that employs the photoresist layer 1577 as an etch mask. A dry etch (such as an anisotropic reactive ion etch) or a wet etch can be employed. In one embodiment, a two step anisotropic etch process can be employed to sequentially etch the physically exposed portions of the second material layer 1430 and the physically exposed portions of the intermediate material layer 1420. For example, if the second material layer 1430 comprises silicon nitride, a reactive ion etch chemistry employing a combination of $CF_4$, $SF_6$, and $O_2$ can be employed to etch the second material layer 1430. If the intermediate material layer 1420 comprises silicon, a reactive ion etch chemistry employing a combination of $SF_6$, $O_2$, and $CHF_3$ can be employed. The etch process can be selective to the first material of the first material layer 1420.

Referring to FIG. 15F and step 1365 of FIG. 13B, the photoresist layer 1577 can be removed from above the remaining portion of the second material layer 1430, for example, by ashing.

Subsequently, the processing steps corresponding to step 1370 of FIG. 13B and FIG. 14C can be performed to selectively deposit a metal material. As discussed above, the metal material can be deposited at a higher nucleation density on the second material layer 1430 than on the first material layer 1410 so that the metal material is deposited as at least one continuous layer, such as the metal material layer 1440 illustrated in FIG. 14C, on the second material layer 1430 and as isolated islands 1441 on the first material layer 1410.

The processing steps corresponding to step 1380 of FIG. 13B and FIG. 14D are then performed to remove the isolated islands 1441 of the metal material from the bevels and the back side of the substrate 110, while not removing the at least one layer of the metal material (such as the metal material layer 1440 illustrated in FIG. 14D.

Processing steps corresponding to step 1390 of FIG. 13B can be subsequently performed to form the blocking dielectric and control gate electrodes.

Figure 16A:
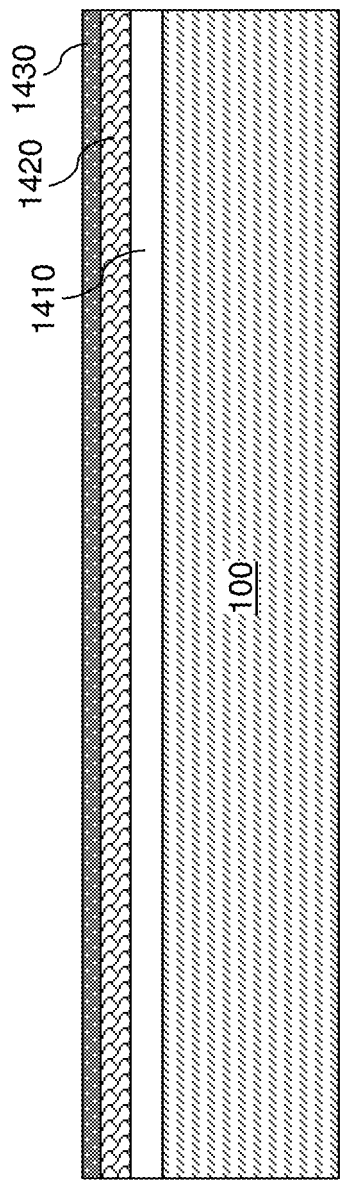

FIGS. 16A-16F illustrate a third exemplary process sequence that can be employed to reduce metal contamination from a selective metal material deposition process according to an embodiment of the present disclosure. Referring to FIG. 16A, a region of an exemplary structure is illustrated, which can be a region of the exemplary structure of FIG. 14A or a region of the exemplary structure of FIG. 15A. The exemplary structure of FIG. 16A illustrates a portion of the substrate 100, and a portion of a stack of material layers (1410, 1420, 1430) overlying the substrate 100. The stack of material layers (1410, 1420, 1430) includes the first material layer 1410, the intermediate material layer 1420, and the second material layer 1430.

In one embodiment, the stack of material layers (1410, 1420, 1430) can include components of floating gate devices. For example, the first material layer 1410 can be a tunneling dielectric layer for floating gate devices to be subsequently formed, and the intermediate material layer 1420 and the second material layer 1430 can be components of the floating gate electrodes for the floating gate devices. In one embodiment, the intermediate material layer 1420 can be employed as a semiconductor floating gate layer and layer 1430 can be employed as a charge trapping dielectric of a hybrid charge storage region of a memory device, such as a hybrid NAND device. In an illustrative example, the first material layer 1410 can include a single silicon oxide layer or an oxide/nitride/oxide (ONO) stack having a thickness in a range from 1 nm to 6 nm, the intermediate material layer 1420 can include amorphous silicon or polysilicon having a thickness in a range from 1 nm to 12 nm, and the second material layer 1430 can include silicon nitride having a thickness in a range from 1 nm to 6 nm, although lesser and greater thicknesses can also be employed for each of the material layers in the stack (1410, 1420, 1430).

Figure 16B:
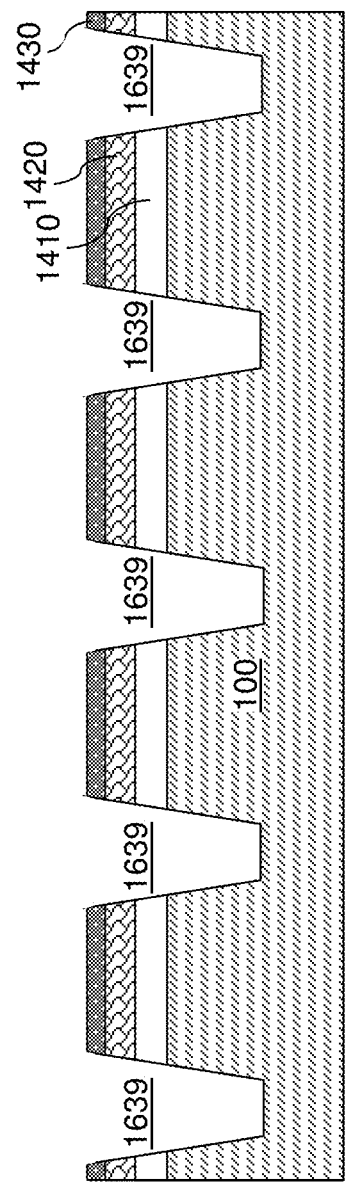

Referring to FIG. 16B, at least one trench 1639 extending at least through the second material layer 1430, the optional intermediate material layer 1420, the first material layer 1410, and optionally into an upper portion of the substrate 100 can be formed. The at least one trench 1639 can be formed, for example, by applying and patterning a photoresist layer (not shown) over the second material layer 1430, lithographically patterning the photoresist layer to form at least one opening therein, and transferring the pattern of the at least one opening through the second material layer 1430, the optional intermediate material layer 1420, the first material layer 1410, and optionally into an upper portion of the substrate 100 employing an anisotropic etch process. The photoresist layer is employed as an etch mask during the anisotropic etch process. The photoresist layer can be subsequently removed, for example, by ashing.

Referring to FIG. 16C, each of the at least one trench 1639 can be filled with a respective dielectric material portion 1640. Specifically, at least one dielectric material can be deposited into the at least one trench 1639 to fill the at least one trench 1639. Portions of the dielectric material located above a horizontal plane including the top surface of the second material layer 1430 can be removed in a planarization process, which can employ, for example, etch back or chemical mechanical planarization. The second material layer 1430 can be employed as the stopping layer for the planarization process. Each remaining portion of the deposited dielectric material constitutes a dielectric material portion 1640. In one embodiment, the dielectric material portions 1640 can be shallow trench isolation structures. The shallow trench isolation structures can electrically isolate semiconductor material portions that are located in the surface region of the substrate 100 and are laterally spaced from one another by the dielectric material portions 1640.

Patterned surfaces are provided on the front side of the substrate 100. The patterned surfaces can include at least one first dielectric material surface (i.e., the top surfaces of the shallow trench isolation structures 1640) and at least one second dielectric material surface (i.e., surfaces of the second material layer 1430) having a lesser hydrophobicity than the first dielectric material surface. Each first dielectric material surface can be a top surface of a dielectric material portion 1640, and each second dielectric material surface can be a top surface of a portion of the second material layer 1430. In one embodiment, each first dielectric material surface can have a first hydrophobicity, and each second dielectric material surface can have a second hydrophobicity, and the first hydrophobicity can be greater than the second hydrophobicity.

The first dielectric material surfaces of the shallow trench isolation structures 1640 can be coplanar with the top surfaces of the second material layers 1430, i.e., be located within a same two-dimensional plane, after the planarization process. Thus, the entirety of the patterned surfaces including the at least one first dielectric material surface (i.e., the top surfaces of the shallow trench isolation structures 1640) and at least one second dielectric material surface can be coplanar.

In one embodiment, the dielectric material of the at least one dielectric material portion 1640 can comprise silicon oxide, and the second material of the second material layer 1430 can be silicon nitride. In one embodiment, the first material of the first material layer 1410 can comprise silicon oxide. In one embodiment, the intermediate material layer can comprise a semiconductor material such as silicon or a compound semiconductor material.

Referring to FIG. 16D, the processing steps of FIG. 14C and step 1370 of FIG. 13B can be subsequently performed to selectively deposit a metal material. The metal material can be deposited at a higher nucleation density on the second dielectric material surface of the second dielectric material layer 1430 than on the first dielectric material surface of the at least one dielectric material portion 1640. The metal material can be deposited as metal material portions 1660 on the second dielectric material surfaces. The thickness of each metal material portion 1660 can be in a range from 1 nm to 10 nm, although lesser and greater thicknesses can also be employed.

The metal material may not be deposited on the first dielectric material surface of the at least one dielectric material portion 1640, or may be deposited as isolated islands (not shown) on the first dielectric material surface of the at least one dielectric material portion 1640. The isolated islands of the metal material do not physically contact one another, and do not form an electrically conductive path. At any rate, isolated islands of the metal material, even if present, do not cover, or contact, more than 1% of the surface of the first dielectric material surface of the at least one dielectric material portion 1640. In one embodiment, the deposited metal material covers less than 0.1% (e.g., 0.0000001 to 0.1%) of the surface of the first dielectric material surface of the at least one dielectric material portion 1640. In one embodiment, the deposited metal material covers less than 0.01% of the surface of the first dielectric material surface of the at least one dielectric material portion 1640. In one embodiment, the deposited metal material covers less than 0.001% of the surface of the first dielectric material surface of the at least one dielectric material portion 1640. In one embodiment, the deposited metal material covers less than 0.00001% of the surface of the first dielectric material surface of the at least one dielectric material portion 1640. In one embodiment, the deposited metal material covers less than 0.000001% of the surface of the first dielectric material surface of the at least one dielectric material portion 1640.

The thickness of each metal material portion 1660 (which can be a metal material layer) can be in a range from 2 nm to 200 nm, although lesser and greater thicknesses can also be employed. The metal material does not cover a predominant portion of each top surface of the at least one dielectric material portion 1640 at a time of termination of the selective metal deposition process. Each metal material portion 1660 can completely cover the entire area of an underlying portion of the second material layer 1430.

In one embodiment, isolated islands of the metal material can be present on a top surface of one or more of the at least one dielectric material portion 1640 at the time of termination of the selective metal deposition process. The isolated islands have a maximum dimension not greater than the thickness of the continuous layer of the deposited metal material, i.e., the thickness of the metal material portions 1660. In one embodiment, the isolated islands can have a maximum dimension that is not greater than ⅕ of the thickness of the metal material portions 1660 at the time of termination of the selective metal material deposition process. In one embodiment, the isolated islands can have a maximum dimension that is not greater than ¹/₁₀ of the thickness of the metal material portions 1660 at the time of termination of the selective metal material deposition process. In one embodiment, the isolated islands can have a maximum dimension that is not greater than ¹/₂₀ of the thickness of the metal material portions 1660 at the time of termination of the selective metal material deposition process. In one embodiment, the isolated islands can have a maximum dimension that is not greater than 5 nm (e.g., 0.1 to 5 nm), and may have a maximum dimension not greater than 3 nm, at the time of termination of the selective metal material deposition process. In one embodiment, the selective metal deposition process can be terminated when the isolated islands of the metal material has a maximum dimension not greater than 5 nm.

In one embodiment, the selective metal material deposition process can be a conformal deposition process. In other words, the thickness of the deposited metal material in areas where deposition of the metal material occurs can be uniform throughout the areas of deposition. In one embodiment, the selective metal material deposition process can employ an atomic layer deposition process.

In a non-limiting illustrative example, the atomic layer deposition process can employ a metal oxide precursor gas, and the metal material can be deposited by reduction of adsorbed molecules of the metal oxide precursor gas by a reducing gas such as hydrogen, silane, and/or diborane. For example, the atomic layer deposition process can employ $RuO_4$ as a precursor gas, the metal material can be ruthenium deposited by reduction of adsorbed molecules of $RuO_4$.

In one embodiment, each of the metal material portions 1660 can be physically isolated from each other, and can be employed as portions of charge storage regions in a memory device such as a hybrid NAND memory device.

At least one of the metal material portions 1660 can be formed as a component of a floating gate of a floating gate device. If a first material layer 1410 is a tunneling dielectric layer for a floating gate device to be subsequently formed, each vertical stack of an intermediate material layer 1420, a second material layer 1430, and a metal material portion 1660 overlying the first material layer 1410 can constitute a floating gate electrode of the floating gate device.

Figure 16E:
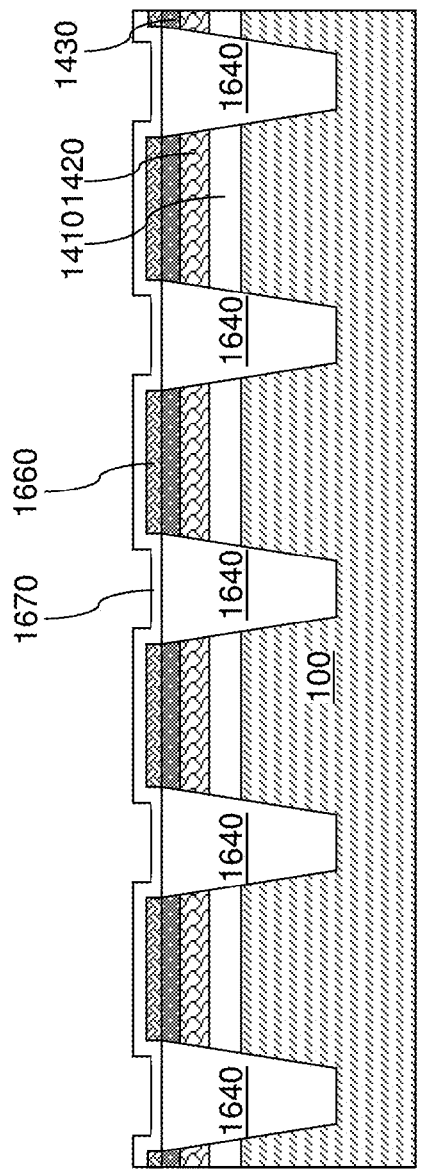

Referring to FIG. 16E and step 1390 of FIG. 13B, a first capping layer 1670 can be deposited on the metal material portions 1660, the first dielectric material surface(s) of the at least one dielectric material portion 1640, and the isolated island of the metal material (if present). In one embodiment, the first capping layer 1670 can be a dielectric material layer including a dielectric material such as silicon oxide, silicon nitride, organosilicate glass, and/or a dielectric metal oxide. In one embodiment, the first capping layer 1670 can be a blocking dielectric layer that includes a blocking dielectric employed to electrically isolate charge storage regions, as embodied in the metal material portions 1660, from a control gate electrode to be subsequently formed. In one embodiment, the first capping layer 1670 can be conformally deposited, and can have a thickness in a range from 3 nm to 10 nm, although lesser and greater thicknesses can also be employed.

If the first capping layer 1670 is a blocking dielectric layer of a floating gate device, then each first material layer 1410 can be a tunneling dielectric layer for a floating gate device, and each vertical stack of an intermediate material layer 1420, a second material layer 1430, and a metal material portion 1660 overlying the first material layer 1410 can be a hybrid charge storage region (e.g., hybrid floating gate electrode) of the floating gate device. If the first capping layer 1670 is a blocking dielectric layer, the first capping layer 1670 can include a dielectric material such as silicon oxide and/or aluminum oxide.

Figure 16F:
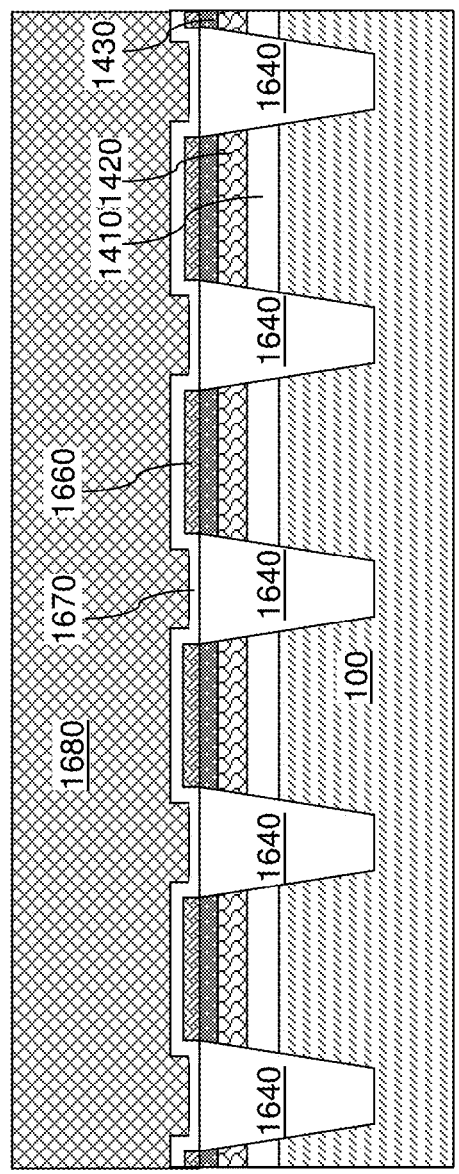

Referring to FIG. 16F and still referring to step 1390 of FIG. 13B, a second capping layer 1680 can be deposited over the first capping layer 1670. The second capping layer 1680 can include a conductive material such as tungsten, copper, aluminum, ruthenium, cobalt, titanium, tantalum, alloys thereof, and/or conductive compounds, such as TiN thereof. In one embodiment, the second capping layer 1680 can be a conductive material layer that functions as the control gate electrode for the hybrid charge storage regions. In this case, a memory array structure including self-aligned charge storage regions can be provided. Thus, in this embodiment, the second capping layer 1680 is a control gate electrode of a floating gate memory device, such as a hybrid floating gate NAND memory device. Layer 1680 is patterned into a plurality of control gate electrodes which extend parallel to the page in FIG. 16F, such that only one control gate electrode is visible.

In the method of FIGS. 16A-16F, the metal material portions 1660 are selectively deposited after formation of the shallow trench isolation structures 1640. This avoids metal (e.g., Ru) contamination in the trenches 1639. In contrast, if the metal material (e.g., Ru) is formed prior to forming the trenches 1639, then etching of the trenches 1639 through the metal material may contaminate the trenches with metal residue.

The various selective deposition methods for forming a metal material layer 1440 or metal material portions 1660 can be employed in combination with area-controlled clean (wet etch) processes to reduce contamination of metal materials on the back side and the bevel regions of a substrate. By removing residual metal materials from regions that can be contacted by handling mechanisms (such as robotic handles), cross-contamination of metal among different process tools can be minimized or eliminated.

The exemplary structure illustrated in FIG. 16F can include a floating gate device. The floating gate device includes a semiconductor channel (a surface portion of the substrate 100 located between a pair of shallow trench isolation structures 1640) located in a substrate 100; a shallow trench isolation structure 1640 laterally contacting the semiconductor channel; a tunneling dielectric layer located on the semiconductor channel and comprising a first material layer 1410; a hybrid floating gate structure (1420, 1430, 1660) comprising a stack of an intermediate material layer (e.g., doped semiconductor floating gate) 1420, a second material layer (e.g., silicon nitride charge trapping dielectric) 1430, and a metal material portion (e.g., metal capping layer) 1660 and located over the tunneling dielectric layer; a blocking dielectric layer 1670 overlying the floating gate structure (1420, 1430, 1660); and a plurality of control gate electrodes 1680 overlying the blocking dielectric layer 1670. The interface between the intermediate material layer 1420 and the second material layer 1430 can be coplanar with the top surface of the shallow trench isolation structure 1640.

The metal (e.g., Ru) material portions 1660 are located entirely above the top surface of the shallow trench isolation structures 1640 since portions 1660 are formed after the structures 1640. Likewise, the blocking dielectric layer 1670 is continuous over the structures 1640 and is located entirely above the top surface of the structures 1640 since layer 1670 is formed after the structures 1640.

In one embodiment, an interface (i.e., a horizontal interface) between the blocking dielectric layer 1670 and the shallow trench isolation structure 1640 can be coplanar with the interface between the intermediate material layer 1420 and the second material layer 1430. In one embodiment, a sidewall of the shallow trench isolation structure 1640 can contact sidewalls of the semiconductor channel, the tunneling dielectric layer 1410, the intermediate material layer 1420, and the second material layer 1430. Preferable, the structure 1640 does not contact the sidewalls of the metal material portions 1660.

In one embodiment, the intermediate material layer 1420 can comprise a semiconductor material such as amorphous silicon or polysilicon, the second material layer 1430 can comprise silicon nitride, the metal material portions 1660 comprise ruthenium, and the shallow trench isolation structure 1640 can comprise silicon oxide.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. All of the publications, patent applications and patents cited herein are incorporated herein by reference in their entirety.

What is claimed is:

1. A method of making a NAND memory device comprising a semiconductor channel and a plurality of control gate electrodes, the method comprising selectively forming metal floating gate material on a second dielectric material surface having a lesser hydrophobicity than a first dielectric material surface;
   further comprising:
   providing patterned surfaces over a substrate, the patterned surfaces comprising the first dielectric material surface and the second dielectric material surface having the lesser hydrophobicity than the first dielectric material surface;
   performing a selective metal deposition process that deposits the metal floating gate material at a higher nucleation density on the second dielectric material surface than on the first dielectric material surface; and
   depositing a blocking dielectric and the plurality of control gate electrodes over the metal floating gate material.

2. A method of making a NAND memory device comprising a semiconductor channel and a plurality of control gate electrodes, the method comprising selectively forming metal floating gate material on a second dielectric material surface having a lesser hydrophobicity than a first dielectric material surface;

wherein the floating gate metal material is deposited as a metal material portion on the second dielectric material surface and as isolated islands of the metal material on the first dielectric material surface that do not cover more than 1% of the first dielectric material surface.

3. The method of claim 2, wherein:

the isolated islands of the metal material do not physically contact one another, and do not form an electrically conductive path;

the first dielectric material comprises a silicon oxide tunnel dielectric;

the second dielectric material comprises a silicon nitride charge trapping dielectric; and the metal material comprises ruthenium deposited employing an atomic layer deposition process.

4. The method of claim 3, wherein the atomic layer deposition process employs $RuO_4$ as a precursor gas, and the ruthenium is deposited by reduction of adsorbed molecules of $RuO_4$.

5. The method of claim 3, further comprising forming a polysilicon floating gate between the tunnel dielectric and the silicon nitride charge trapping dielectric to form a hybrid charge storage region comprising the polysilicon floating gate, the silicon nitride charge trapping dielectric and the ruthenium capping layer.

6. The method of claim 5, wherein the first dielectric material surface further comprises surfaces of silicon oxide shallow trench isolation regions exposed between stacks comprising the polysilicon floating gate and the silicon nitride charge trapping dielectric.

7. The method of claim 2, further comprising:

providing patterned surfaces over a substrate, the patterned surfaces comprising the first dielectric material surface and the second dielectric material surface having the lesser hydrophobicity than the first dielectric material surface;

performing a selective metal deposition process that deposits the metal floating gate material at a higher nucleation density on the second dielectric material surface than on the first dielectric material surface; and depositing a blocking dielectric and the plurality of control gate electrodes over the metal floating gate material.

* * * * *